United States Patent
Ohno et al.

(10) Patent No.: US 7,148,149 B2
(45) Date of Patent: Dec. 12, 2006

(54) METHOD FOR FABRICATING NITRIDE-BASED COMPOUND SEMICONDUCTOR ELEMENT

(75) Inventors: Hiroshi Ohno, Osaka (JP); Satoshi Tamura, Osaka (JP); Tetsuzo Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 34 days.

(21) Appl. No.: 11/017,681

(22) Filed: Dec. 22, 2004

(65) Prior Publication Data

US 2005/0159000 A1    Jul. 21, 2005

(30) Foreign Application Priority Data

Dec. 24, 2003  (JP)  ............... 2003-427183

(51) Int. Cl.
*H01L 21/302* (2006.01)
*H01L 21/3065* (2006.01)

(52) U.S. Cl. ............... 438/704; 438/706; 438/718; 438/745

(58) Field of Classification Search ............... 438/704, 438/706, 745, 718
See application file for complete search history.

(56) References Cited

U.S. PATENT DOCUMENTS

| | | | | |
|---|---|---|---|---|
| 5,773,369 A | * | 6/1998 | Hu et al. ............... | 438/746 |
| 5,968,845 A | * | 10/1999 | Chino et al. ............ | 438/704 |
| 6,083,841 A | * | 7/2000 | Yano et al. ............. | 438/706 |
| 6,111,275 A | * | 8/2000 | Hata ...................... | 257/97 |
| 6,245,687 B1 | | 6/2001 | Barsky et al. | |
| 6,673,702 B1 | | 1/2004 | Orita et al. | |

FOREIGN PATENT DOCUMENTS

| | | |
|---|---|---|
| EP | 1 120 483 A2 | 8/2001 |
| JP | 03091927 A * | 4/1991 |
| JP | 103091927 A * | 4/1991 |
| JP | 8-203862 | 8/1996 |
| JP | 10-233385 | 9/1998 |
| JP | 2000-68608 | 3/2000 |
| JP | 2001-250809 | 9/2001 |
| JP | 2002-231705 | 8/2002 |
| JP | 2003-158113 | 5/2003 |
| JP | 2003-179027 | 6/2003 |

OTHER PUBLICATIONS

Etching Process for Semiconductor Wafer, Suzaki, Apr. 17, 1991, English Abstract of JP 403091927 A, 2 pages.*
Etching Process for Semiconductor Wafer, Suzaki, Apr. 17, 1991, English Abstract of JP 03091927 A, 2 pages.*
Adesida, I. et al., "Dry and Wet Etching for Group III—Nitrides", MRS Internet. J. Nitride Semiconductor Res. 4S1, GI.4 (1999).

* cited by examiner

*Primary Examiner*—Nadine G. Norton
*Assistant Examiner*—Lynette T. Umez-Eronini
(74) *Attorney, Agent, or Firm*—McDermott Will & Emery LLP

(57) ABSTRACT

A method for fabricating a nitride semiconductor element according to the present invention comprises the steps of: forming a nitride semiconductor layer 13 on a base substrate 11; forming, on part of the upper surface of the nitride semiconductor layer 13, a conductive film 14 made of an electron emitting layer 14b and a dry etching mask layer 14a from bottom to top; performing dry etching on the nitride semiconductor layer 13; and performing wet etching on the nitride semiconductor layer 13 by emitting electrons from the nitride semiconductor layer 13 through the conductive film 14 to the outside.

14 Claims, 15 Drawing Sheets

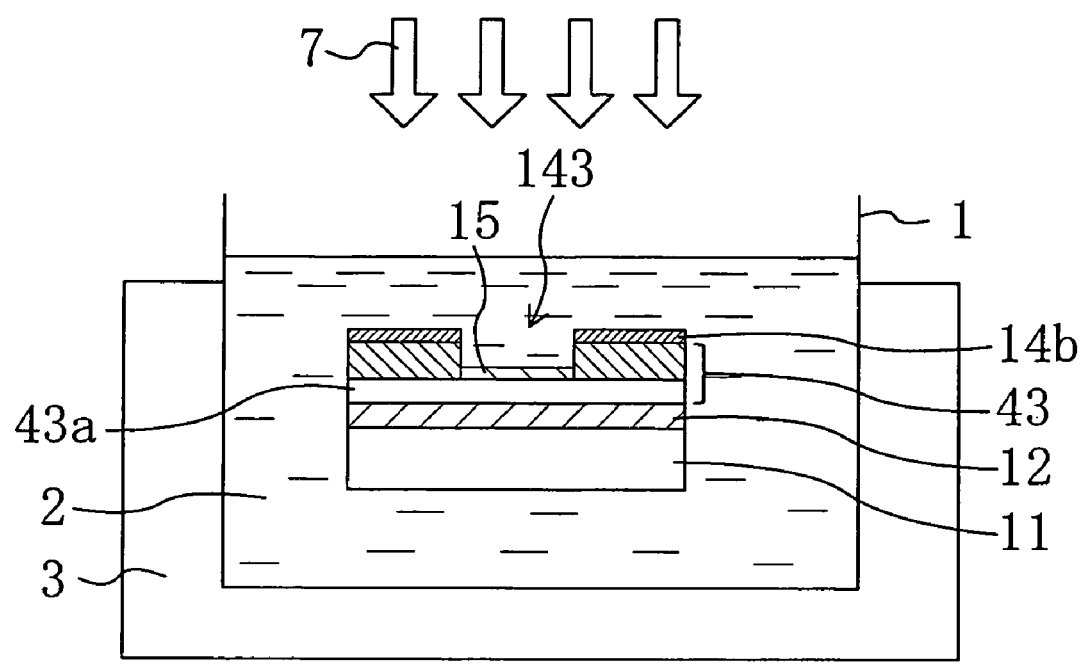

METHOD FOR FABRICATING NITRIDE-BASED COMPOUND SEMICONDUCTOR ELEMENT

CROSS-REFERENCE TO RELATED APPLICATIONS

This application claims priority under 35 U.S.C. § 119 on Patent Application No. 2003-427183 filed in Japan on Dec. 24, 2003, the entire contents of which are hereby incorporated by reference. The entire contents of Patent Application No. 2004-365411 filed in Japan on Dec. 17, 2004 are also incorporated by reference.

BACKGROUND OF THE INVENTION (a) Fields of the Invention

The present invention relates to methods for fabricating a nitride-based compound semiconductor element (hereinafter, referred simply to as "nitride semiconductor element"), and in particular to methods for fabricating a nitride semiconductor element, which include a wet etching process.

(b) Description of Related Art

Nitride semiconductor elements represented by $Al_xGa_yIn_{(1-x-y)}N$ ($0 \leq x \leq 1$, $0 \leq y \leq 1$, $0 \leq 1-x-y \leq 1$) are expected to be light emitting elements with wide band gaps ranging from the visible region to the ultra-violet region, and have already been put into practical use as blue-color light-emitting diodes and laser diodes. Also, nitride semiconductor elements are expected to be electronic elements of high-power, high-frequency devices.

In fabricating such a nitride semiconductor element, a nitride-based compound semiconductor layer (hereinafter, referred simply to as "nitride semiconductor layer") thereof is often processed by etching in order to form the structure and shape of the element. Generally, the etching includes wet etching and dry etching. Since nitride semiconductor layers are physically and chemically stable, it is difficult to subject the layer to wet etching. For this reason, dry etching is conventionally employed in which etching is performed in a plasma atmosphere using reactive gas such as $Cl_2$ or HCl, for example, as disclosed in L. T. Romano et al, "Dry and Wet Etching for Group-III Nitrides", MRS Internet Journal of Nitride Semiconductor Research, 4S1 1999 G1.4.

When dry etching is performed on the nitride semiconductor layer, however, a damaged layer is created, by an etching agent used in the dry etching, in the surface of the nitride semiconductor layer subjected to the dry etching. The damaged layer is a defective portion of crystal structure of the nitride semiconductor layer, and its electrical properties and its optical properties such as band gap exhibit different behaviors from the electrical properties and optical properties of the internal nitride semiconductor layer.

Heretofore, because of the presence of the damaged layer, the portion of the nitride semiconductor layer where the damaged layer exists has never been used for a semiconductor element. In actuality, the created damaged layer has been left as it stands. However, recently, in order to enhance the performance of a semiconductor element, utilization of the portion of the nitride semiconductor layer subjected to dry etching as a semiconductor element has been envisioned. In this case, if, like the conventional example, the portion of the nitride semiconductor layer where the damaged layer is created is used, with the damaged layer not removed, as a semiconductor element, the fabricated semiconductor element may have a poor performance because the damaged layer differs from the internal nitride semiconductor layer in electrical and optical properties and the like. Therefore, in the case where the portion of the nitride semiconductor layer where the damaged layer is created is used as a semiconductor element, the damaged layer has to be removed in order for the semiconductor element to exhibit a commercially acceptable performance. In addition, if a semiconductor element is fabricated by regrowing an additional nitride semiconductor layer on the surface of the nitride semiconductor layer where the damaged layer is formed, the additional nitride semiconductor layer regrown may be affected by the damaged layer to have a highly defective crystal structure. This may lead to poor performance of the semiconductor element. Therefore, also in this case, the damaged layer has to be removed.

SUMMARY OF THE INVENTION

An object of the present invention is to provide a method for fabricating a nitride semiconductor element, which removes a damaged layer created in a nitride semiconductor layer during dry etching in the course of a later fabrication process of the nitride semiconductor element, that is to say, which ultimately creates no damaged layer even though dry etching has been performed without fail. Another object of the present invention is to provide a method for fabricating a nitride semiconductor element by performing wet etching by a small number of fabrication steps and a simple batch process.

A first fabrication method according to the present invention for the purpose of accomplishing the above objects comprises the steps of: forming a nitride-based compound semiconductor layer on a base substrate; forming a conductive film as an etching mask on part of the surface of the nitride-based compound semiconductor layer; performing dry etching on the nitride-based compound semiconductor layer; and performing wet etching on the nitride-based compound semiconductor layer by emitting electrons from the nitride-based compound semiconductor layer through the conductive film to the outside.

In the present invention, a nitride-based compound semiconductor element means a semiconductor element represented by $Al_xGa_yIn_{(1-x-y)}N$ ($0 \leq x \leq 1$, $0 \leq y \leq 1$, $0 \leq 1-x-y \leq 1$).

A second fabrication method according to the present invention for the purpose of accomplishing the above objects comprises the steps of: forming a nitride-based compound semiconductor layer on a base substrate; forming, on part of the surface of the nitride-based compound semiconductor layer, a multilayer conductive film whose uppermost layer is a dry etching mask layer; performing dry etching on the nitride-based compound semiconductor layer; removing the dry etching mask layer; and performing wet etching on the nitride-based compound semiconductor layer by emitting electrons from the nitride-based compound semiconductor layer through the conductive film to the outside.

Preferably, in the first and second fabrication methods of the present invention, in the step of performing dry etching, a damaged layer is created in the nitride-based compound semiconductor layer, and in the step of performing wet etching, at least the damaged layer is removed.

In the first and second fabrication methods of the present invention, the conductive film may include a layer containing Ni.

In the first and second fabrication methods of the present invention, the nitride-based compound semiconductor layer may be provided with at least a single layer containing Al, and the dry etching is performed on the layer containing Al.

Preferably, in the first and second fabrication methods of the present invention, in the step of performing wet etching, an external voltage is not applied to the conductive film.

A third fabrication method according to the present invention for the purpose of accomplishing the above objects comprises the steps of: forming a nitride-based compound semiconductor layer on a base substrate; forming, on part of the surface of the nitride-based compound semiconductor layer, a conductive film as an electron emitting film for emitting electrons from the nitride-based compound semiconductor layer to the outside; and performing wet etching on the nitride-based compound semiconductor layer by emitting electrons from the nitride-based compound semiconductor layer through the conductive film to the outside, the wet etching being performed without applying an external voltage to the conductive film.

In the third fabrication method according to the present invention, it is preferable that the nitride-based compound semiconductor layer is formed of a plurality of layers in which an uppermost layer is an n-type nitride-based compound semiconductor layer and a layer lower than the n-type nitride-based compound semiconductor layer is a p-type nitride-based compound semiconductor layer, and in the step of performing wet etching, the p-type nitride-based compound semiconductor layer serves as a layer for stopping wet etching.

Wherein, the words "a layer lower than the n-type nitride-based compound semiconductor layer is a p-type nitride-based compound semiconductor layer" means that the p-type nitride-based compound semiconductor layer may be located right below the n-type nitride-based compound semiconductor layer or that one or more n-type nitride-based compound semiconductor layers are intervened between the n-type nitride-based compound semiconductor layer and the p-type nitride-based compound semiconductor layer.

Also, the words "the p-type nitride-based compound semiconductor layer serves as a layer for stopping wet etching" means that the wet etching is not performed on the p-type nitride-based compound semiconductor layer and the semiconductor layers located lower than the p-type nitride-based compound semiconductor layer.

Moreover, the n-type nitride-based compound semiconductor layer is preferably an AlGaN layer.

Preferably, in the first, second, and third fabrication methods of the present invention, the conductive film has a layer containing Ti and Au or a layer containing Ti and Pt.

In the first, second, and third fabrication methods of the present invention, the nitride-based compound semiconductor layer may be formed of a plurality of layers, and the plurality of layers may be formed of a plurality of nitride-based semiconductors having different element compositions, respectively.

In the first, second, and third fabrication methods of the present invention, the wet etching may use a solution containing one of KOH, NaOH, $H_3PO_4$, $H_2SO_4$, and HCl.

Preferably, in the first, second, and third fabrication methods of the present invention, in the step of performing wet etching, the nitride-based compound semiconductor layer is radiated with ultrasonic waves.

In the first, second, and third fabrication methods of the present invention, another nitride-based compound semiconductor layer may be provided on the nitride-based compound semiconductor layer subjected to the wet etching.

BRIEF DESCRIPTION OF THE DRAWINGS

FIG. 10 is a view showing the construction of wet etching of the fifth embodiment.

DETAILED DESCRIPTION OF THE PREFERRED EMBODIMENTS

Figure 1A:
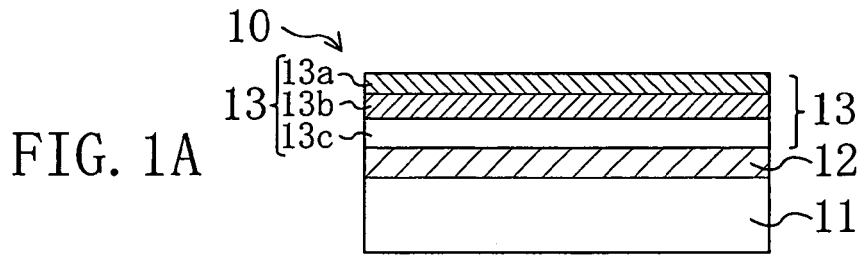
FIGS. 1A through 1E are views of etching steps of a first embodiment.

Prior to description of embodiments of the present invention, description will be made of a method for fabricating a nitride-based compound semiconductor element (hereinafter, referred simply to as "nitride semiconductor element") the inventors have studied.

As previously mentioned, under the present circumstances, an effective etching method of a nitride-based compound semiconductor layer (hereinafter, referred simply to as "nitride semiconductor layer") is dry etching only. In this case, however, a damaged layer is created in the surface of a nitride semiconductor layer subjected to dry etching. Herein, the damaged layer means: 1. a portion from which molecules are exfoliated; 2. a non-stoichiometric portion formed by defects of elements constituting the semiconductor; 3. a defective portion of a crystal lattice which is formed around the surface of the nitride semiconductor layer and can affect even the crystal structure inside the semiconductor; and 4. a portion where a dry etching agent or hydrogen gas is injected into the semiconductor. This is described in L. T. Romano et al, "Dry and Wet Etching for Group III-Nitrides", MRS Internet Journal of Nitride Semiconductor Research, 4S1 1999 G1.4. Previously, the portion of the nitride semiconductor layer subjected to dry etching has never been used as a semiconductor element. Therefore, even if the damaged layer created in the nitride semiconductor layer by the dry etching is left as it stands, the damaged layer will not affect the performance of a semiconductor element. However, recently, in order to enhance the performance of the semiconductor element, utilization of the portion of the nitride semiconductor layer subjected to dry etching as a semiconductor element has been envisioned. Moreover, in order to fabricate a semiconductor element with high performance, the created damaged layer has to be removed. Note that use of part of the nitride semiconductor layer as a semiconductor element means, for example, use of part of the nitride semiconductor layer as a waveguide.

However, as for the removal of the damaged layer described above, there have been no cases studied. Hence, the inventors have made studies of the removal for the first time. To be more specific, the inventors studied implementation of wet etching described below as a removal method of the damaged layer. First, the inventors tried forming a wet etching mask on part of the surface of a nitride semiconductor layer and simply immersing the nitride semiconductor layer in an etching solution such as an aqueous solution of sodium hydroxide. However, wet etching of the nitride semiconductor layer did not proceed at all. Against this backdrop, the inventors heated this etching solution to a high temperature. Then, only part of the damaged layer was removed and there were many irregularities on the surface of the nitride semiconductor layer subjected to the wet etching. From this result, we found that the nitride semiconductor layer after wet etching cannot be used as a semiconductor element. Thus, we reviewed the appropriateness of performing well-known wet etching on the nitride semiconductor layer.

Figure 15:
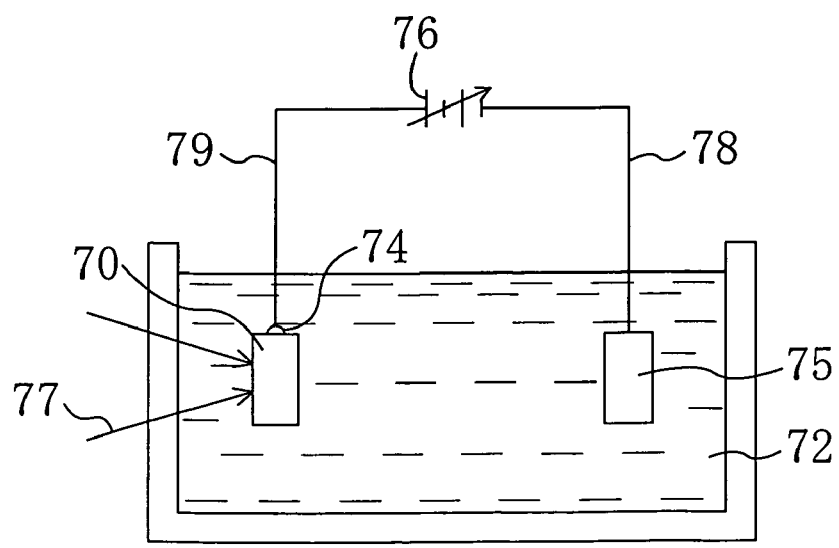
FIG. 15 is a view showing the construction of wet etching of a conventional example.

For example, wet etching disclosed in Japanese Unexamined Patent Publication No. 2001-250809 is performed using an electrochemical cell. The electrochemical cell disclosed in this publication is shown in FIG. 15. Description of this publication is as follows. In this electrochemical cell, GaN (nitride semiconductor layer) 70 for performing wet etching is used as an anode, a platinum rod 75 is used as a cathode, and a basic solution such as potassium hydroxide or a dilute acid such as sulfuric acid is used as an electrolytic solution (etching solution) 72. Then, as shown in FIG. 15, a wire 78 connects the platinum rod 75 to a negative terminal of a bias source 76, while a wire 79 connects a contact 74 provided on the GaN 70 to a positive terminal of the bias source 76. Thereby, a voltage generated in the bias source 76 is applied through the contact 74 to the GaN 70. When the voltage supplied from the bias source 76 is beyond resistive losses of the electrolytic solution 72 and the GaN 70 and the standard electrochemical cell potential of the electrochemical cell, wet etching for the GaN 70 starts. During this etching, the wet etching rate is proportional to the level of a bias voltage supplied from the bias source 76. Further, if the wet etching is performed with the GaN 70 radiated with ultraviolet light 77, the GaN 70 is subjected to wet etching at a higher etching rate than that of the GaN 70 not radiated with the ultraviolet light 77.

Figure 16A:
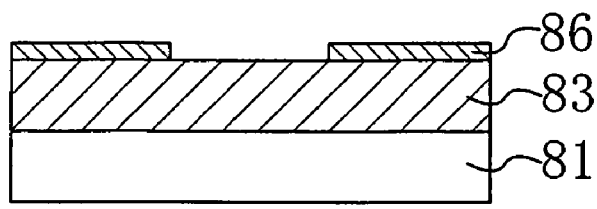
FIGS. 16A through 16D are views of wet etching steps of the conventional example.
Figure 16B:
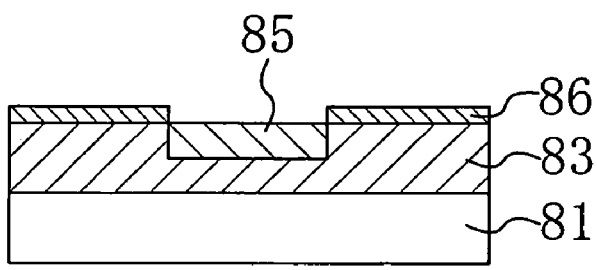
Figure 16C:
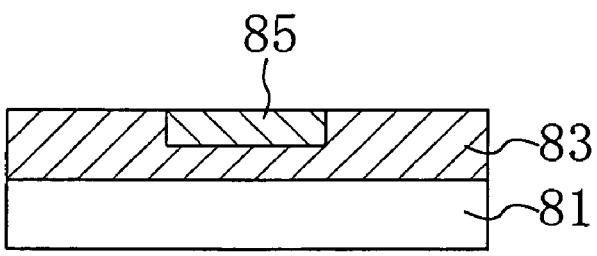
Figure 16D:
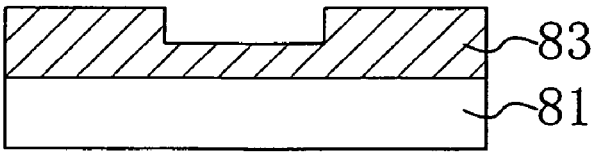

On the other hands, in wet etching disclosed in Japanese Unexamined Patent Publication No. H10-233385, crystal defects are artificially generated in the portion of the nitride semiconductor layer to be subjected to the wet etching. FIG. 16 is views showing wet etching steps disclosed in this publication. The description of this publication is as follows. Referring to FIG. 16A, first, a mask 86 made of $SiO_2$ is formed on part of the surface of a GaN film (nitride semiconductor layer) 83 formed on a sapphire substrate 81. Subsequently, Ga ions are implanted into a portion of the GaN film where no $SiO_2$ mask 86 is formed. Then, as shown in FIG. 16B, defects (defective portion) 85 of the crystal structure of the film are produced in the GaN film 83. Thereafter, as shown in FIG. 16C, the $SiO_2$ mask 86 is removed from the surface of the GaN film 83. When the GaN film 83 on which the $SiO_2$ mask 86 has been removed is immersed in, for example, an aqueous KOH solution, wet etching as shown in FIG. 16D is performed on the portion of the GaN film 83 into which Ga ions have been injected. In Japanese Unexamined Patent Publication No. H10-233385, another technique is also disclosed in which artificial formation of a region having a highly defective crystal structure in the GaN film contributes to wet etching for this region. Although this technique is not illustrated, concrete description of this technique is as follows. First, an $Al_2O_3$ film having a highly defective crystal structure is formed in part of a sapphire substrate. Next, GaN (nitride semiconductor layer) is grown on the formed $Al_2O_3$ film and a portion of the sapphire substrate whose upper surface is not formed with the $Al_2O_3$ film. Then, the GaN grown on the $Al_2O_3$ film has a highly defective crystal structure. That is to say, if GaN is grown by this procedure, GaN having a highly defective crystal structure is grown on the $Al_2O_3$ film and GaN having a less defective crystal structure is grown on the portion of the sapphire substrate whose upper surface is not formed with the $Al_2O_3$ film. Thus, when these types of grown GaNs are immersed in an aqueous KOH solution, wet etching is performed only on the GaN grown on the $Al_2O_3$ film. In the technique disclosed in Japanese Unexamined Patent Publication No. H10-233385, by artificially increasing the defect density of the nitride semiconductor layer, selective wet etching can be performed on the portion of GaN having a high defect density.

Japanese Unexamined Patent Publication No. 2002-231705 discloses the fact that if ion implantation is performed to form in a semiconductor layer a portion having a highly defective crystal structure, selective wet etching can be performed on the formed portion.

However, in the case described in Japanese Unexamined Patent Publication No.2001-250809 where wet etching is performed using the electrochemical cell, the wire 79 electrically connects the GaN 70 to the positive terminal of the bias source 76 and the wire 78 electrically connects the cathode 75 to the negative terminal of the bias source 76. Furthermore, a voltage has to be applied between the GaN 70 and the cathode 75. This complicates the construction of the wet etching, so that this wet etching technique has a drawback that it is unsuitable for mass production of the nitride semiconductor element. Particularly, in the case where patterns not subjected to wet etching are all continued on a single substrate, it is sufficient that the wire is connected onto the nitride semiconductor layer only once. However, in the case where the patterns not subjected to wet etching are not continued and some of the patterns are spaced apart, it is necessary to provide a connecting point to each of the spaced patterns. That is to say, in the case where patterns not to be etched are not continued and some of the patterns are spaced apart, the wire has to be attached again and again to points of the surface of the nitride semiconductor layer corresponding to the individual spaced patterns. As is apparent from this, the method for performing wet etching using the electrochemical cell, which is disclosed in Japanese Unexamined Patent Publication No. 2001-250809, is very disadvantageous to mass production of the nitride semiconductor element, and restricts the type of patterns capable of being subjected to the wet etching. In addition, in the case where the nitride semiconductor layer is subjected to wet etching, the wet etching rate greatly depends on the quality of the crystal of the nitride semiconductor. Therefore, irregularities of whisker shapes induced by defects are left on the surface of the nitride semiconductor layer subjected to the wet etching, which leads to a drawback that the surface has a poor smoothness. Moreover, as the quality of the crystal of the nitride semiconductor is improved, the defectiveness of the crystal structure thereof is lowered. This leads to a drawback that in wet etching for a nitride semiconductor having good crystal quality, the wet etching rate becomes slow.

Furthermore, in the case where the nitride semiconductor layer is composed of a plurality of layers having different element compositions, if, for example, a layer containing Al or a layer with high resistance due to a low carrier density is present in the plurality of layers, the distribution of the electrochemical potential within the surface cannot be neglected and then uniform wet etching cannot be performed. If, for example, a layer having a high Al content and a large band gap is present in the plurality of layers, the energy of the band gap of the semiconductor layer is equivalent to or larger than the energy of light. This weakens the effect of inducing and promoting wet etching, so that the wet etching rate becomes extremely slow or wet etching does not proceed. Consequently, the method for performing wet etching using the electrochemical cell described in Japanese Unexamined Patent Publication No. 2001-250809 cannot perform wet etching on a layer containing Al such as an AlGaN layer.

In the cases disclosed in Japanese Unexamined Patent Publication No. H10-233385 and Japanese Unexamined Patent Publication No. 2002-231705 where ion implantation contributes to wet etching, the wet etching can be controlled simply by controlling the depth of implanted ions. However, it is not easy to control the depth of implanted ions, so that these cases have a drawback that it is difficult to make an accurate control of the wet etching. In the case described in Japanese Unexamined Patent Publication No. H10-233385 where the nitride semiconductor layer is grown on the $Al_2O_3$ film and then wet etching is performed, the $Al_2O_3$ film has to be formed on the sapphire substrate before the wet etching is performed. Therefore, this case has a drawback that the number of fabrication steps of the nitride semiconductor element is increased and the fabrication process thereof becomes complicated.

As described above, the conventional wet etching methods are difficult to apply to industrial use. To overcome this difficulty, the inventors diligently studied etching methods easily applicable to industrial use. From this study, the inventors successfully found the present invention which can remove a damaged layer created by dry etching by performing wet etching by a small number of process steps and a simple batch process and which can perform the wet etching without applying an external voltage. Hereinafter, embodiments of the present invention will be described based on the accompanying drawings. Note that the following embodiments are shown simply as an example, and the present invention is not limited to these embodiments.

First Embodiment

Hereinafter, a first embodiment will be described in detail based on FIGS. 1 and 2. FIG. 1 is views of etching steps of the first embodiment, and FIG. 2 is a view showing the construction of wet etching of the first embodiment. In the first embodiment, description will be made of a method for fabricating a semiconductor laser element in which a portion subjected to dry etching is used as a waveguide.

Figure 2:
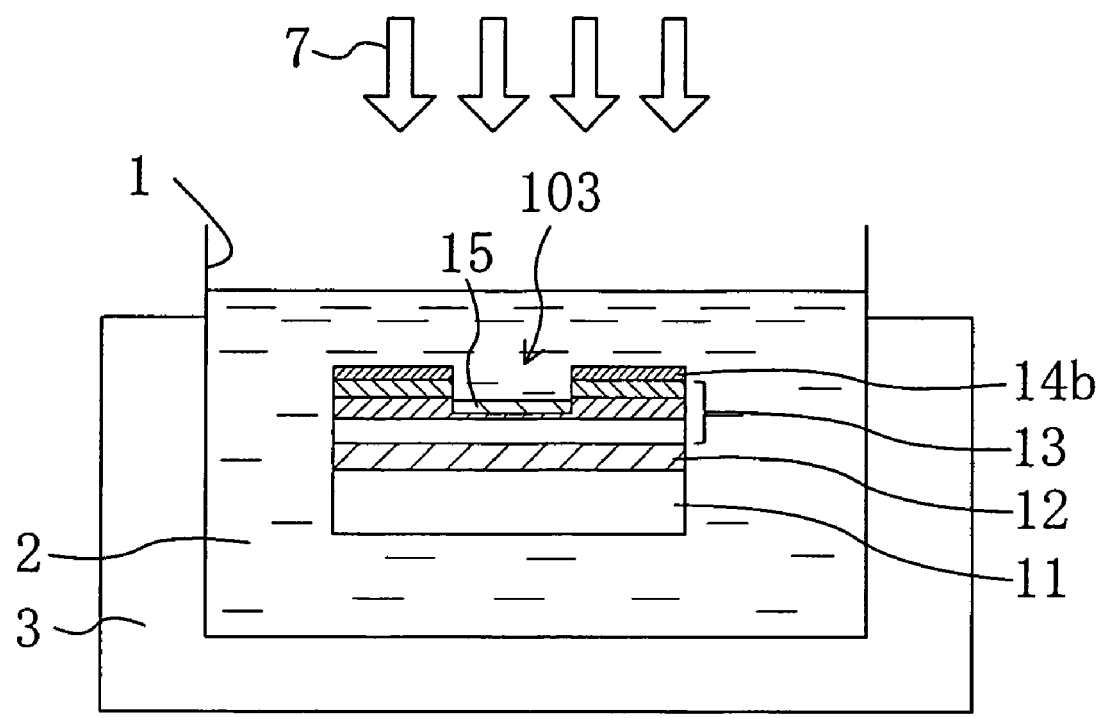
FIG. 2 is a view showing the construction of wet etching of the first embodiment.

Referring to FIG. 1A, first, by a metal organic chemical vapor deposition method (MOCVD method), a GaN-based buffer layer 12 is grown on a base substrate 11, and a nitride semiconductor layer 13 is grown on the GaN-based buffer layer 12. Thus, a nitride semiconductor 10 is formed.

In this structure, it is sufficient that the base substrate 11 is any substrate of sapphire, SiC, GaN, silicon, $Ga_2O_3$, $MgAlO_2$, and ZnO and that the base substrate 11 is a substrate well-known as a base substrate of a nitride semiconductor element. However, it is preferably a sapphire substrate.

The nitride semiconductor layer 13 is made of GaN, AlN, InN, and a mixed crystal of these materials. The nitride semiconductor layer 13 contains InGaN multiple quantum well (MQW) as an active layer and an AlGaN current blocking layer, and is represented by AlGaN/p-GaN/InGaN MQW/n-GaN. To be more specific, the nitride semiconductor layer 13 is constructed as follows: on the surface of the GaN-based buffer layer 12, an n-GaN layer and an InGaN multiple quantum well (MQW) as an active layer are formed (which are shown by 13c as a single layer in FIG. 1A); a p-GaN layer 13b is formed on the layer 13c; and an AlGaN current blocking layer 13a is formed on the p-GaN layer 13b. In this structure, a layer formed by sequentially stacking an n-GaN layer (guide layer), an n-AlGaN layer (cladding layer), and an n-GaN layer is called the n-GaN layer. The thickness of the AlGaN current blocking layer 13a is preferably from 50 to 300 nm inclusive, and the thickness of the p-GaN layer 13b is preferably from 20 to 200 nm inclusive. The thickness of the n-GaN layer (guide layer) forming the n-GaN layer is preferably from 50 to 200 nm inclusive, and the thickness of the n-AlGaN layer (cladding layer) forming the n-GaN layer is preferably from 500 to 2000 nm inclusive. The most preferable thicknesses of the AlGaN current blocking layer 13a, the p-GaN layer 13b, and the n-GaN layer are 150 nm, 125 nm, and 4000 nm, respectively. In the layers forming the n-GaN layer, the most preferable thicknesses of the n-GaN layer (guide layer), the n-AlGaN layer (cladding layer), and the n-GaN layer are 150 nm, 1200 nm, and 3000 nm, respectively. The nitride semiconductor layer 13 may be a single-layer film of nitride semiconductor, and it is also acceptable that the active layer of the nitride semiconductor layer 13 is formed of an InGaN single quantum well.

Figure 1B:
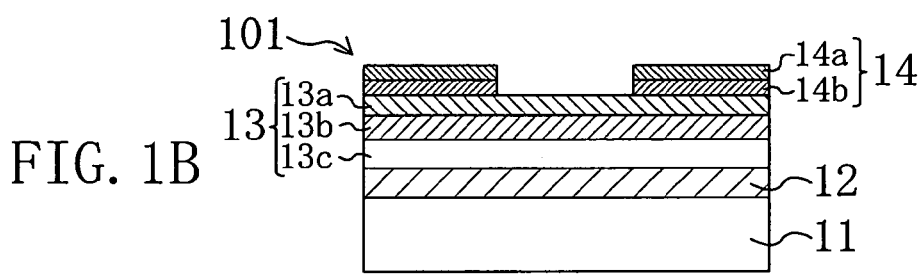

Next, using evaporation and normal photolithography, a Ti layer, a Au layer, and a Ni layer are sequentially formed on both edge portions of the upper surface of the nitride semiconductor layer 13 to form conductive films 14. Thus, as shown in FIG. 1B, a nitride semiconductor 101 in which portions of the surface of the nitride semiconductor layer 13 are formed with the conductive films 14 (hereinafter, referred simply to as "nitride semiconductor with the conductive film") is formed.

In this structure, the Ni layer is a dry etching mask layer 14a serving as a mask used for dry etching described later. Therefore, the dry etching mask layer 14a is not limited to the Ni layer as long as an alternative material used therefor exhibits resistance to an etching agent of dry etching. For example, the dry etching mask layer 14a may be a tungsten layer or a molybdenum layer, and it may also be a layer made of $SiO_2$. However, as described later, the dry etching mask layer 14a is removed after the dry etching process. Considering that the dry etching mask layer 14a will be removed later, the dry etching mask layer 14a is preferably a Ni layer.

Figure 1C:
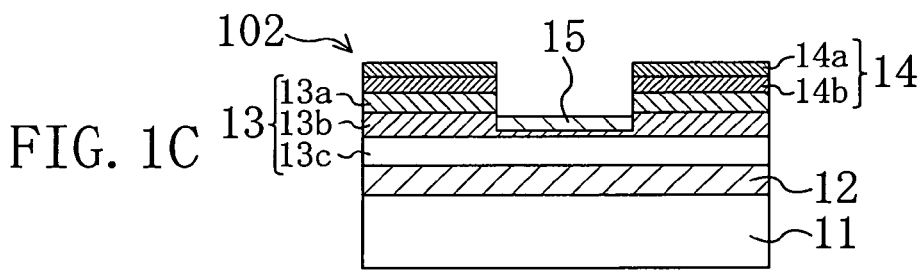

The Ti layer and the Au layer constitute a layer 14b for an electron emitting, which serves as a film for emitting, in wet etching, electrons from the nitride semiconductor layer 13 to the outside thereof. Therefore, the material for the layer 14b for the electron emitting is not limited to Ti and Au, and the layer 14b may be formed of a Ti layer and a Pt layer, of a Ni layer and a Au layer, of a Ni layer and a Pt layer, of a Cr layer and a Au layer, or of a Cr layer and a Pt layer. However, as described later, the layer 14b for the electron emitting is removed after the wet etching process. Considering that the layer 14b for the electron emitting will be removed later, the layer 14b for the electron emitting is preferably formed of a Ti layer and a Au layer. Moreover, a Ti layer has an excellent adhesion to the nitride semiconductor layer. Therefore, also in order for the layer 14b for the electron emitting to serve stably as a mask for wet etching, the layer 14b is preferably formed of a Ti layer and a Au layer. For purposes of brevity, FIGS. 1B and 1C show the layer 14b for the electron emitting as a single layer. The thickness of the dry etching mask layer 14a is preferably 200 nm or greater, and more preferably 400 nm. The thickness of the layer 14b for the electron emitting is preferably 50 nm or greater, and more preferably 200 nm.

Subsequently, by an ECR plasma or an ICP plasma using gas containing chlorine elements such as chlorine gas ($Cl_2$), dry etching is performed on the nitride semiconductor 101 with the conductive film. Thereby, the surface portion of the nitride semiconductor layer 13 on which the dry etching mask layer 14a is not formed is subjected to dry etching. Then, as shown in FIG 1C, removal is made of all the portions of the AlGaN current blocking layer 13a on which the dry etching mask layer 14a is not formed and of part of the portion of the p-GaN layer 13b over which the dry etching mask layer 14a is not formed, and a damaged layer 15 is created in the surface of the p-GaN layer 13b subjected to the dry etching. That is to say, as shown in FIG. 1C, the damaged layer 15 is created in the surface of the p-GaN layer 13b over which the dry etching mask layer 14a is not formed.

In this dry etching, by performing dry etching for about two minutes with a plasma for the dry etching set at a high frequency power of 200 W, the nitride semiconductor 101 with the conductive film can be subjected to dry etching to reach an etching depth of 175±25 nm. The magnitude of the high frequency power for generating the plasma is not limited to 200 W, and it is preferably from 50 to 300 W inclusive.

Thereafter, with a nitric acid solution, only the dry etching mask layer 14a is removed from the nitride semiconductor 102 after the dry etching shown in FIG. 1C to form the nitride semiconductor 103 with the electron emitting film. The dry etching process is completed by the step described above, and a wet etching process follows.

Figure 1D:
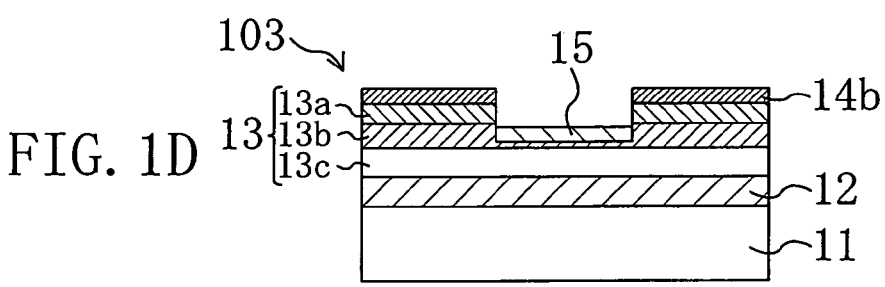

In the wet etching process, as shown in FIG. 2, first, a container 1 is filled with an aqueous solution of potassium hydroxide (0.01 to 1 mol/l) serving as an etching solution 2. The nitride semiconductor 103 with the electron emitting film shown in FIG. 1D is immersed in the etching solution 2, and the container 1 is put within an ultrasonic generator 3. Then, the nitride semiconductor 103 with the electron emitting film is radiated with ultraviolet light 7 having a larger energy than the energy of the band gap of the p-GaN layer 13b, and the etching solution 2 and the nitride semiconductor 103 with the electron emitting film are radiated with ultrasonic waves (not shown) generated from the ultrasonic generator 3. By these radiations, the nitride semiconductor 103 with the electron emitting film is subjected to wet etching. By performing wet etching with the nitride semiconductor 103 with the electron emitting film radiated with ultrasonic waves, no irregularities of whisker shapes induced by crystal defects can be created on the surface of the p-GaN layer 13b subjected to the wet etching, and concurrently the surface roughness (RMS) of the layer can be 1 nm or smaller. Then, the damaged layer 15 is completely removed from the nitride semiconductor 103 with the electron emitting film, thereby completing the wet etching process. It is also acceptable that the etching solution 2 is an aqueous solution of sodium hydroxide (NaOH), a hot aqueous solution of phosphoric acid ($H_3PO_4$), sulfuric acid ($H_2SO_4$), or an aqueous solution of hydrochloric acid (HCl). The ultrasonic generator 3 is a well-known ultrasonic generator. Ultrasonic waves generated from the generator preferably have a frequency from 10 to 100 kHz inclusive, and preferably have an output power from 10 to 200 W inclusive. More preferably, ultrasonic waves having a frequency from 20 to 40 kHz inclusive and an output power from 20 to 50 W inclusive are radiated to the nitride semiconductor 103 with the electron emitting film.

Herein, the mechanism of the wet etching performed by the above-mentioned construction will be described briefly. Since the layer 14b for the electron emitting is formed on part of the surface of the nitride semiconductor 103 with the electron emitting film, electrons within the nitride semiconductor 103 with the electron emitting film are emitted from the nitride semiconductor 103 with the electron emitting film through the layer 14b for the electron emitting to the etching solution 2. As a result of this, holes are concentrated around the surface of the nitride semiconductor 103 with the electron emitting film. In the nitride semiconductor 103 under the wet etching, the surface of the p-GaN layer 13b subjected to dry etching has been formed with the damaged layer 15. Since, as previously described, the electrical properties of the damaged layer 15 are different from the electrical properties of the internal semiconductor layer, the holes within the nitride semiconductor 103 with the electron emitting film are concentrated selectively at the surface portion of the damaged layer 15. From such a mechanism, the damaged layer 15 created by dry etching is subjected to selective wet etching. Accordingly, simply by immersing the nitride semiconductor 103 with the electron emitting film in the etching solution 2, the damaged layer 15 created by dry etching is subjected to wet etching, and thus the damaged layer 15 is removed from the nitride semiconductor 103 with the electron emitting film.

In the first embodiment, since the semiconductor layer to be subjected to wet etching is the p-GaN layer 13b, the layer inherently has holes. Therefore, it is unnecessary to radiate the p-GaN layer 13b with the ultraviolet light 7 shown in FIG. 2 to produce electron-hole pairs in the p-GaN layer 13b. In addition, the wet etching in the first embodiment removes only the damaged layer 15 which is created on the surface of the p-GaN layer 13b subjected to the dry etching having been performed before the wet etching. As is apparent from the above, in the first embodiment, it is not always necessary to radiate the nitride semiconductor 103 with the electron emitting film with the ultraviolet light 7 shown in FIG. 2 to perform wet etching. However, radiation of the ultraviolet light 7 raises the wet etching rate to some extent, whereby also in the first embodiment, wet etching is preferably performed with the ultraviolet light 7 radiated.

Figure 1E:
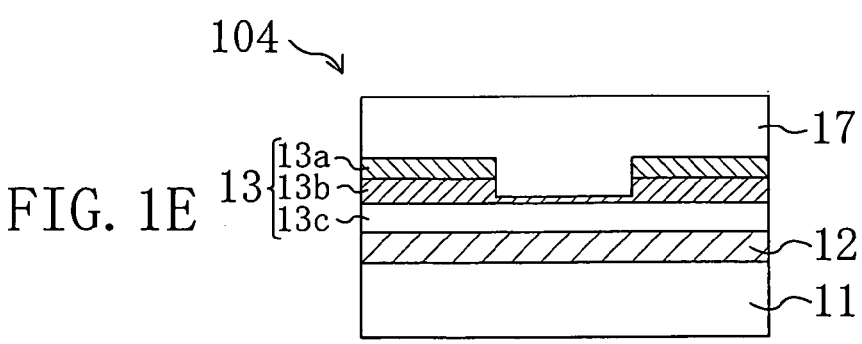

Subsequently to the wet etching process, with hydrofluoric acid, buffered hydrofluoric acid, or the like, the layer 14b for the electron emitting is removed from the nitride semiconductor 103 with the electron emitting film. Then, by an MOCVD method, an epitaxial layer of another nitride semiconductor layer 17 is grown on the surface of the resulting nitride semiconductor. Thus, the nitride semiconductor element 104 shown in FIG. 1E is fabricated. The fabricated nitride semiconductor element 104 can be used as a semiconductor laser element in which the portion of the nitride semiconductor layer 13 subjected to dry etching is used as a waveguide.

The following description will be made of effects exerted by the method for fabricating a nitride semiconductor element according to the first embodiment.

In the method for fabricating a nitride semiconductor element according to the first embodiment, the layer 14b for the electron emitting is formed on the surface of the nitride semiconductor 103 with the electron emitting film. Therefore, when the nitride semiconductor 103 with the electron emitting film is immersed in the etching solution 2, electrons within the nitride semiconductor 103 with the electron emitting film are emitted through the layer 14b for the electron emitting from the nitride semiconductor layer 13 to the etching solution 2. As a result of this, holes are present in the surface of the nitride semiconductor 103 with the electron emitting film. Further, since the nitride semiconductor 103 with the electron emitting film has been subjected to dry etching prior to this wet etching, the damaged layer 15 is created in the surface of the p-GaN layer 13b subjected to the dry etching. Since the electrical properties of the damaged layer 15 are different from the electrical properties of the internal nitride semiconductor layer, holes present around the surface of the nitride semiconductor 103 with the electron emitting film are concentrated selectively at the surface of the damaged layer 15. By this concentration, the damaged layer 15 is subjected to wet etching. That is to say, simply by immersing the nitride semiconductor 103 with the electron emitting film in the etching solution 2, the damaged layer 15 is subjected to wet etching. Therefore, unlike the conventional technique, it is unnecessary, in wet etching, to apply an external voltage to the nitride semiconductor layer and to implant ions into the nitride semiconductor layer. Since an external voltage is not applied to the nitride semiconductor layer, complication of the construction of the wet etching can be avoided and additional actions can be eliminated in which electrical connection using a wire is made between a cathode and a negative terminal of a bias source and between the semiconductor layer as an anode and a positive terminal of the bias source. In the first embodiment, the wording "an external voltage is not applied to the nitride-based compound semiconductor layer" means that the nitride-based compound semiconductor layer is simply immersed in the etching solution for use in the wet etching. Moreover, since ion implantation is unnecessary, additional action can be eliminated in which ions are implanted into the substrate or the nitride semiconductor layer, thereby reducing the number of steps conducted in the wet etching.

Also in the case where as shown in FIG. 1B, patterns not subjected to wet etching are not continued and some of the patterns are spaced apart, the nitride semiconductor 103 with the electron emitting film can be subjected to wet etching simply by once immersing in the etching solution 2 the nitride semiconductor 103 with the electron emitting film on which the layers 14b for the electron emitting associated with the spaced patterns are formed. Therefore, as compared to the conventional wet etching method, the wet etching method of the first embodiment can perform wet etching with great ease and on various types of patterns.

In the fabrication method of the first embodiment, the nitride semiconductor 10 can be first subjected to dry etching and then subjected to wet etching to remove the damaged layer 15 having been created in the dry etching process. Therefore, unlike the conventional nitride semiconductor element, in the nitride semiconductor element 104, the portion of the nitride semiconductor layer subjected to dry etching can be utilized as a semiconductor element. As an example, the nitride semiconductor element 104 can be used as a semiconductor laser element in which the portion of the p-GaN layer 13b subjected to dry etching is used as a waveguide. In the nitride semiconductor element 104, the composition of the AlGaN current blocking layer 13a can be selected to control the difference in refractive index between the waveguide and the AlGaN current blocking layer 13a. This provides the nitride semiconductor element 104 serving as a semiconductor laser element with high output power or low noise.

In the fabrication method of the first embodiment, dry etching can offer an easy etching for a layer containing Al that is difficult for the conventional wet etching to etch, that is, for the AlGaN current blocking layer 13a. Therefore, the nitride semiconductor element 104 can be fabricated without concern for the material for the nitride semiconductor layer 13. Moreover, the layer containing Al such as the AlGaN current blocking layer 13a can be used as a waveguide of a semiconductor laser element, so that the nitride semiconductor element 104 fabricated by this method has a widened application area of a semiconductor element.

Furthermore, since in the wet etching process, wet etching is performed with ultrasonic waves radiated to the etching solution 2 and the nitride-based semiconductor 103 with the electron emitting film, formation of irregularities of whisker shapes induced by crystal defects can be suppressed on the surface of the p-GaN layer 13b after the wet etching, and concurrently the surface roughness (RMS) of the layer can be 1 nm or smaller. Therefore, even if an epitaxial layer of another nitride semiconductor layer 17 is grown on the surface of the nitride semiconductor layer after the wet etching, the crystal structure of the grown nitride semiconductor layer 17 contains almost no crystal defects. As a result, the performance of the fabricated semiconductor element will not be degraded. Accordingly, the nitride semiconductor element 104 is also available as a semiconductor element with a current confinement structure, such as a laser diode.

Moreover, in the first embodiment, since dry etching is performed on the AlGaN current blocking layer 13a and part of the p-GaN layer 13b, the damaged layer 15 is created in the surface of the p-GaN layer 13b as shown in FIG. 1C. Although p-type semiconductors such as p-GaN inherently have holes, these holes are not located in the surface of the semiconductor layer. Therefore, for implementation of wet etching for a p-type semiconductor layer, it is absolutely necessary to apply an external voltage (the detail of which will be described later in an explanation of etching mechanism in a fourth embodiment). From this, the wet etching of the first embodiment in which an external voltage is not applied removes only the damaged layer 15 having been created by dry etching, and cannot proceed to the semiconductor layers lying below the damaged layer 15. Accordingly, in the first embodiment, the p-GaN layer 13b serves as a layer for stopping wet etching.

Second Embodiment

Hereinafter, a second embodiment will be described based on FIGS. 3 and 4. FIG. 3 is views of etching steps of the second embodiment, and FIG. 4 is a view showing the construction of wet etching of the second embodiment. Items shown in FIG. 3 that have the same constructions and functions as those shown in FIG. 1 retain the same reference numerals. Items shown in FIG. 4 that have the same constructions and functions as those shown in FIG. 2 retain the same reference numerals.

In the second embodiment, unlike the first embodiment described above, the conductive film 14 is provided on the substantially center portion of the upper surface of the nitride semiconductor layer 13. In the second embodiment, detail description of items overlapping with those in the first embodiment will be omitted.

Figure 3A:
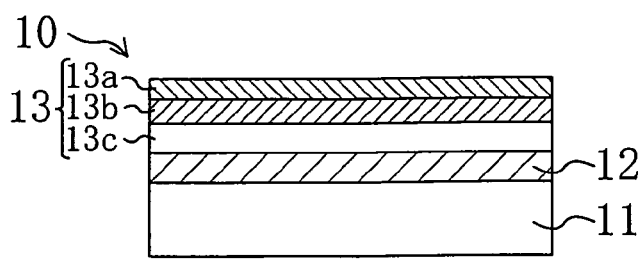
FIGS. 3A through 3E are views of etching steps of a second embodiment.
Figure 4:
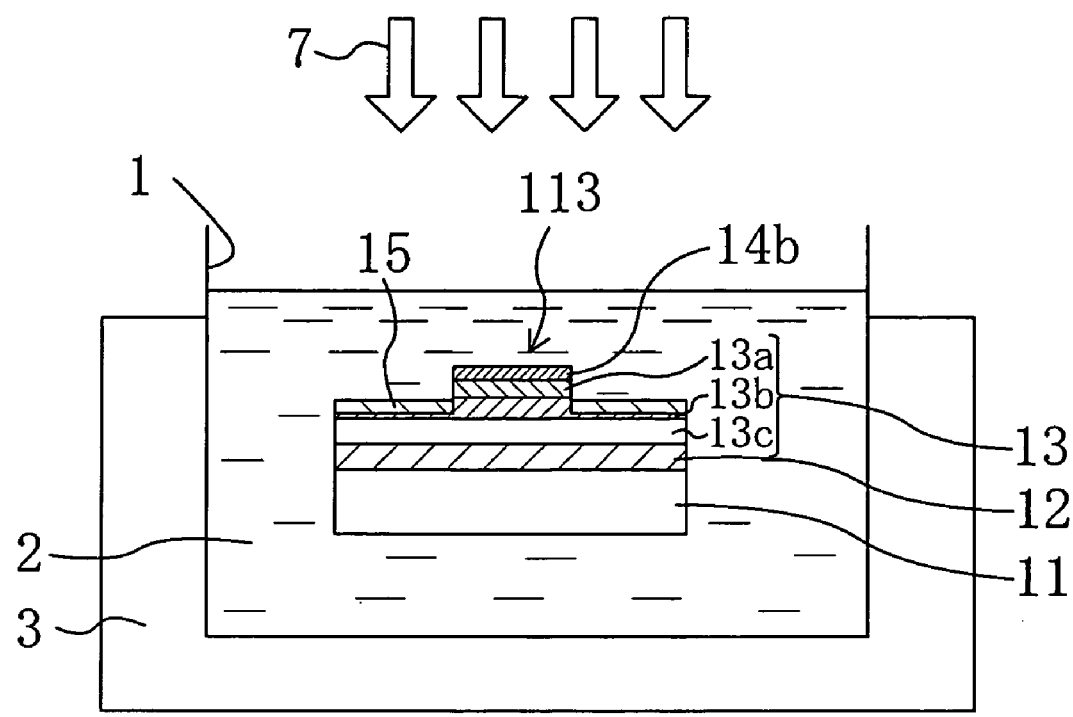
FIG. 4 is a view showing the construction of wet etching of the second embodiment.

Referring to FIG. 3A, first, by an MOCVD method, a GaN-based buffer layer 12 is formed on a base substrate 11, and then a nitride semiconductor layer 13 is formed on the GaN-based buffer layer 12, thereby forming a nitride semiconductor 10.

Figure 3B:
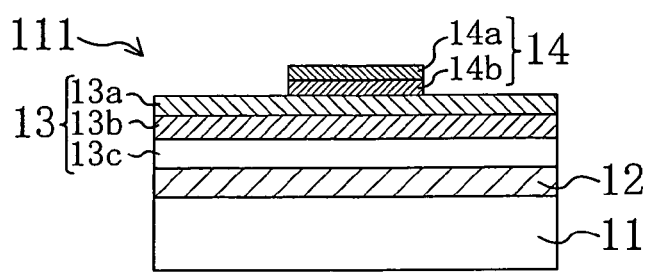

Next, as shown in FIG. 3B, using evaporation and normal photolithography, a substantially center portion of the upper surface of the nitride semiconductor layer 13 constituting the nitride semiconductor 10 is formed with a conductive film 14 composed of a dry etching mask layer 14a and a layer 14b for an electron emitting. Thus, the nitride semiconductor 111 with the conductive film is formed.

Subsequently, dry etching is performed on the nitride semiconductor 111 with the conductive film shown in FIG. 3B. Thereby, the surface portion of the nitride semiconductor layer 13 on which the dry etching mask layer 14a is not formed is subjected to dry etching to create a damaged layer 15 in the surface of the p-GaN layer 13b.

Figure 3C:
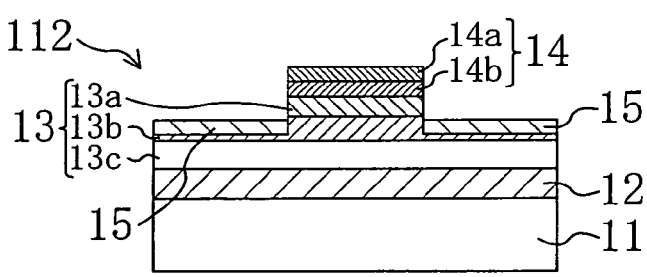
Figure 3D:
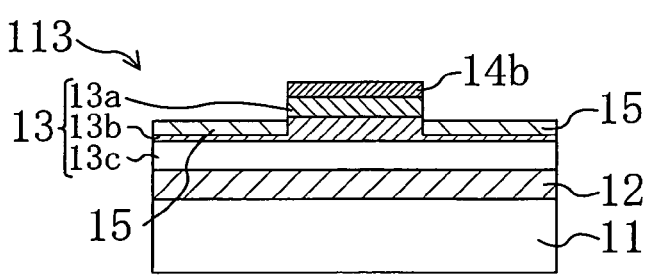

Thereafter, with a nitric acid solution, only the dry etching mask layer 14a is removed from the nitride semiconductor 112 after the dry etching shown in FIG. 3C to form the nitride semiconductor 113 with the electron emitting film shown in FIG. 3D. Then, wet etching shown in FIG. 4 is performed on the nitride semiconductor 113 with the electron emitting film, whereby the damaged layer 15 is removed from the nitride semiconductor 113 with the electron emitting film.

Figure 3E:
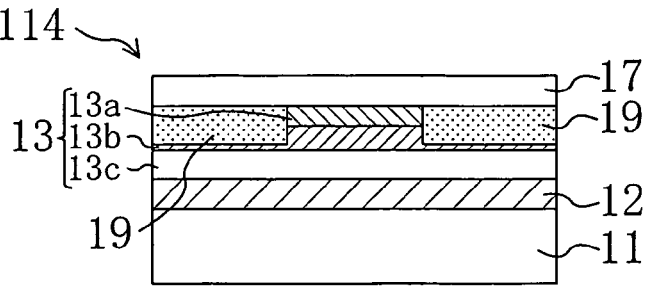

After completion of the wet etching process, the layer 14b for the electron emitting is removed. Thereafter, an insulating film 19 is formed on the surface of the portion of the etched nitride semiconductor layer 13. In this formation, the insulating film 19 may be made of a material having an appropriate difference in refractive index for the nitride semiconductor layer 13, or a material having a different composition from the nitride semiconductor layer 13. Subsequently to this formation, by an MOCVD method, a crystal of another nitride semiconductor layer 17 is grown on the surface of the portion of the nitride semiconductor layer 13 not subjected to the etching and the surface of the insulating film 19. Thus, a nitride semiconductor element 114 shown in FIG. 3E is fabricated.

The method for fabricating a nitride semiconductor element according to the second embodiment exerts almost the same effects as the method for fabricating a nitride semiconductor element according to the first embodiment. Moreover, in the nitride semiconductor element 114 in the second embodiment, the material for the current blocking layer 19 can be selected to control the difference in refractive index between a waveguide and the current blocking layer 19.

Third Embodiment

Hereinafter, a third embodiment will be described based on FIGS. 5 and 6. FIG. 5 is views of etching steps of the third embodiment, and FIG. 6 is a view showing the construction of wet etching of the third embodiment. Items shown in FIG. 5 that have the same constructions and functions as those shown in FIG. 1 retain the same reference numerals. Items shown in FIG. 6 that have the same constructions and functions as those shown in FIG. 2 retain the same reference numerals.

In the third embodiment, unlike the first embodiment described above, a conductive film is composed of a single layer. In all points other than such a composition, the fabrication method of the third embodiment is substantially equal to that of the first embodiment. Hence, in the third embodiment, detail description of items overlapping with those in the first embodiment will be omitted.

Figure 5A:
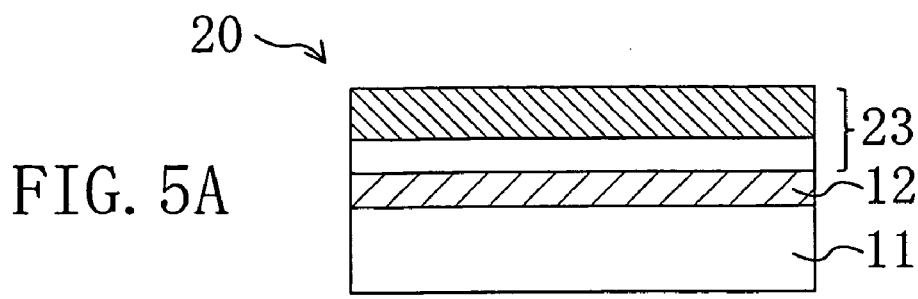
FIGS. 5A through 5D are views of etching steps of a third embodiment.
Figure 6:
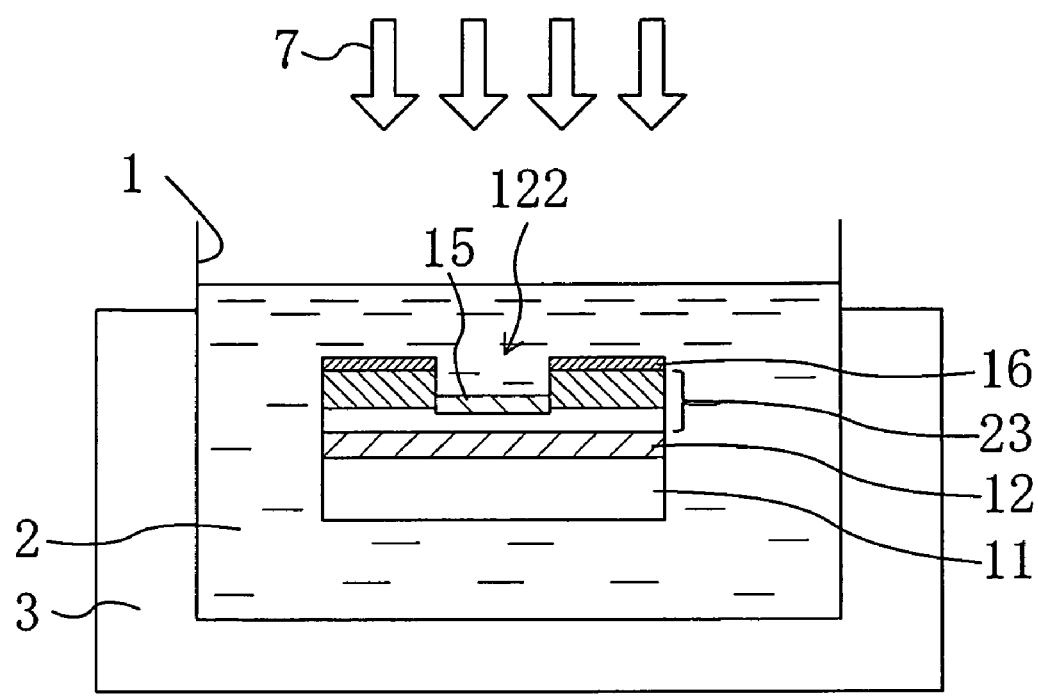
FIG. 6 is a view showing the construction of wet etching of the third embodiment.

Referring to FIG. 5A, first, by an MOCVD method, a GaN-based buffer layer 12 is grown on a base substrate 11, and then a nitride semiconductor layer 23 is formed on the GaN-based buffer layer 12, thereby forming a nitride semiconductor 20.

Figure 5B:
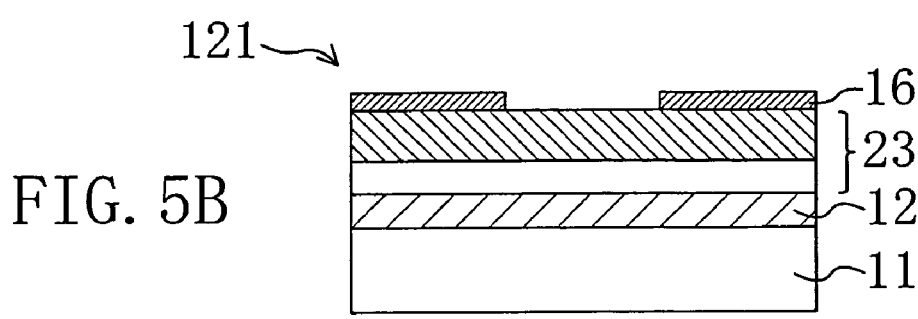
Figure 5C:
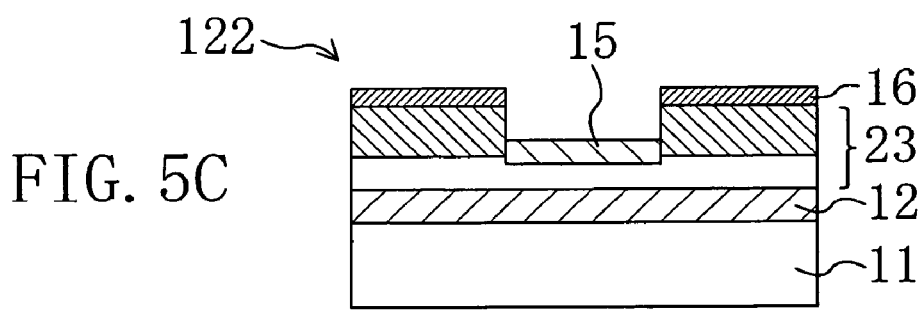

Next, as shown in FIG. 5B, using evaporation and normal photolithography, both edge portions of the upper surface of the nitride semiconductor layer 23 constituting the nitride semiconductor 20 are formed with conductive films 16, respectively. In this structure, the conductive film 16 is a film made of Ni, Pt, or the like which functions both as a dry etching mask and as a film for emitting electrons. Thus, the nitride semiconductor 121 with the conductive film is formed.

Subsequently, dry etching is performed on the nitride semiconductor 121 with the conductive film shown in FIG. 5B. Thereby, the surface portion of the nitride semiconductor layer 23 on which the conductive film 16 is not formed is subjected to dry etching to create a damaged layer 15 in the surface of the nitride semiconductor layer 23. Thereafter, with the conductive film 16 not removed, wet etching shown in FIG. 6 is performed on the nitride semiconductor 122 after the dry etching shown in FIG. 5C, whereby the damaged layer 15 is removed from the nitride semiconductor 122 after the dry etching.

Figure 5D:
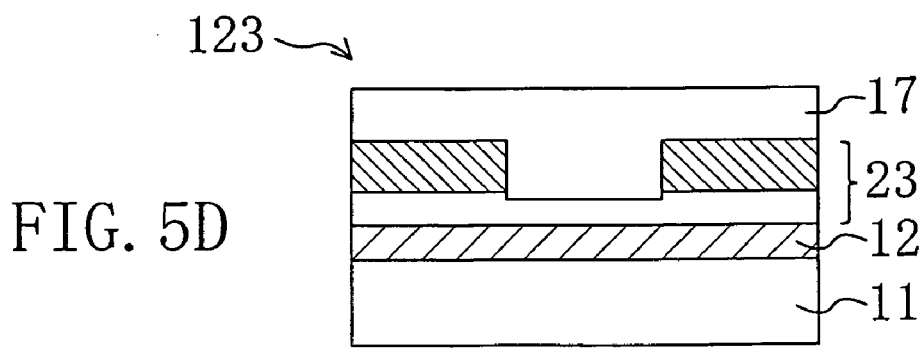

After completion of the wet etching process, the conductive film 16 is removed. Thereafter, by an MOCVD method, a crystal of another nitride semiconductor layer 17 is grown on the surface of the resulting nitride semiconductor. Thus, a nitride semiconductor element 123 shown in FIG. 5D is fabricated.

Hereinafter, description will be made of effects exerted by the method for fabricating a nitride semiconductor element according to the third embodiment.

The method for fabricating a nitride semiconductor element according to the third embodiment exerts the following effects in addition to the effects of the first embodiment. Since the conductive film 16 has the functions as a dry etching mask and as a film for emitting electrons, additional action can be eliminated in which the nitride semiconductor 20 is provided with two layers composed of a dry etching mask layer and a layer for an electron emitting. Concurrently, it is unnecessary to remove the conductive film 16 by two steps.

Note that the nitride semiconductor element 114 described in the second embodiment can also be fabricated using the method for fabricating a nitride semiconductor element according to the third embodiment.

Fourth Embodiment

Hereinafter, a fourth embodiment will be described based on FIGS. 7 and 8. FIG. 7 is views of etching steps of the fourth embodiment, and FIG. 8 is a view showing the construction of wet etching of the fourth embodiment. Items shown in FIG. 7 that have the same constructions and functions as those shown in FIG. 1 retain the same reference numerals. Items shown in FIG. 8 that have the same constructions and functions as those shown in FIG. 2 retain the same reference numerals.

In the fourth embodiment, description will be made of the case where wet etching is performed not only to remove a damaged layer 15 created by dry etching but also to etch a p-type nitride semiconductor layer 33a located more internally than the damaged layer. In the fourth embodiment, detail description of items overlapping with those in the first embodiment will be omitted.

Figure 7A:
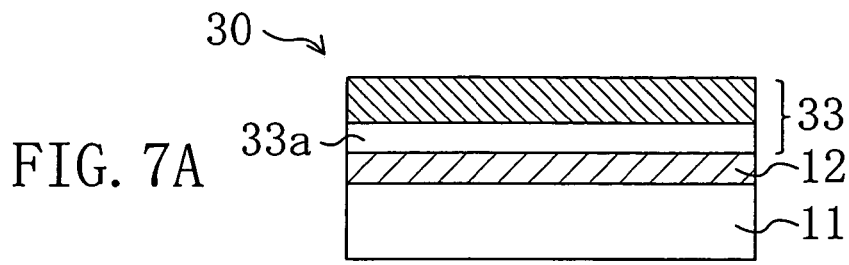
FIGS. 7A through 7E are views of etching steps of a fourth embodiment.
Figure 8:
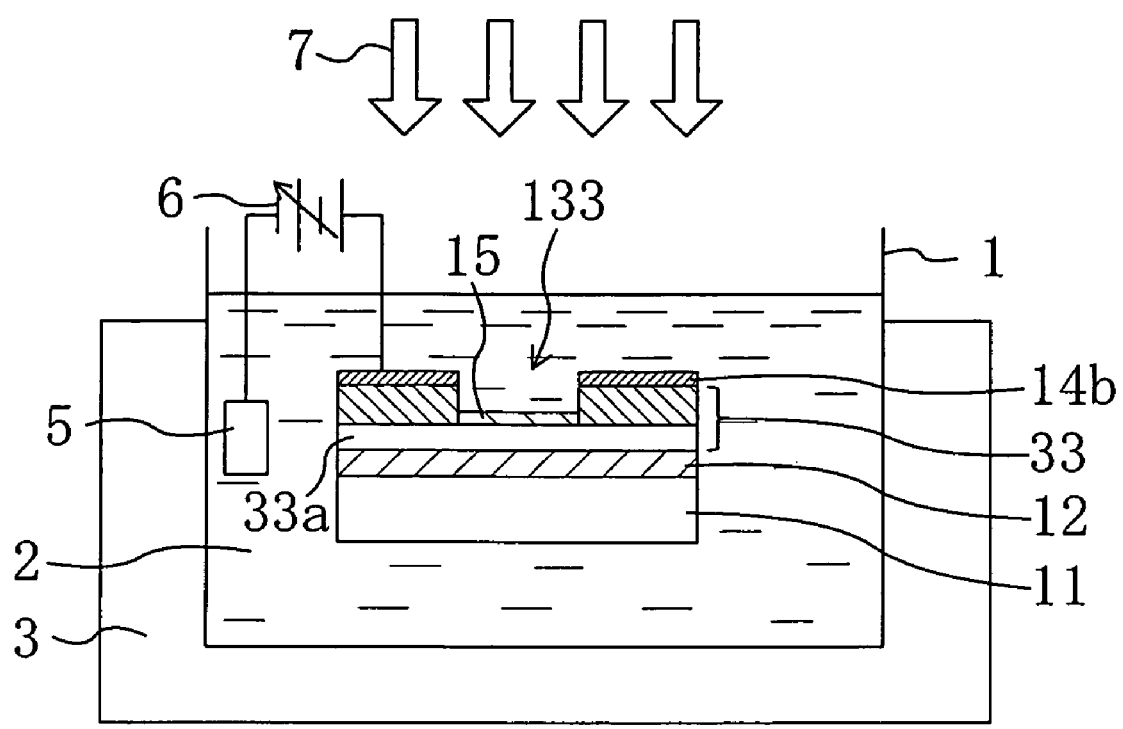
FIG. 8 is a view showing the construction of wet etching of the fourth embodiment.

Referring to FIG. 7A, first, by an MOCVD method, a GaN-based buffer layer 12 is grown on a base substrate 11, and then a nitride semiconductor layer 33 is formed on the GaN-based buffer layer 12, thereby forming a nitride semiconductor 30. In this formation, the nitride semiconductor layer 33 is formed with a p-type semiconductor layer 33a such as p-GaN.

Figure 7B:
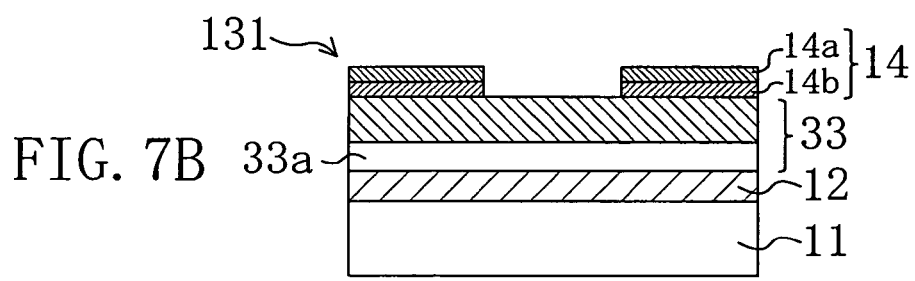

Next, as shown in FIG. 7B, using evaporation and normal photolithography, both edge portions of the upper surface of the nitride semiconductor layer 33 constituting the nitride semiconductor 30 are formed with conductive films 14 each composed of a dry etching mask layer 14a and a layer 14b for an electron emitting. Thus, the nitride semiconductor 131 with the conductive film is formed. The conductive film 14 may be the conductive film 16 described in the third embodiment.

Subsequently, dry etching is performed on the nitride semiconductor 131 with the conductive film shown in FIG. 7B. Thereby, the surface portion of the p-type nitride semiconductor layer 33a on which the dry etching mask layer 14a is not formed is subjected to dry etching to create a damaged layer 15 in the surface of the p-type semiconductor layer 33a.

Figure 7C:
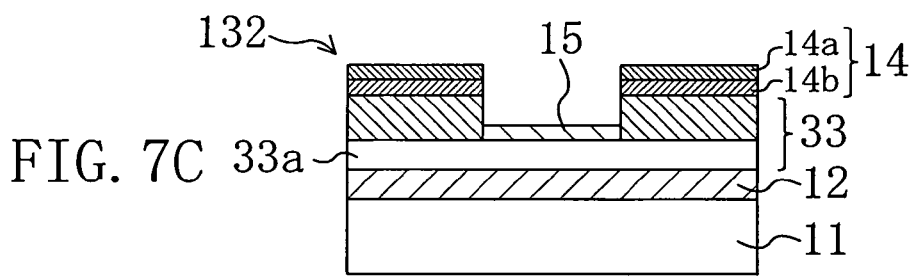
Figure 7D:
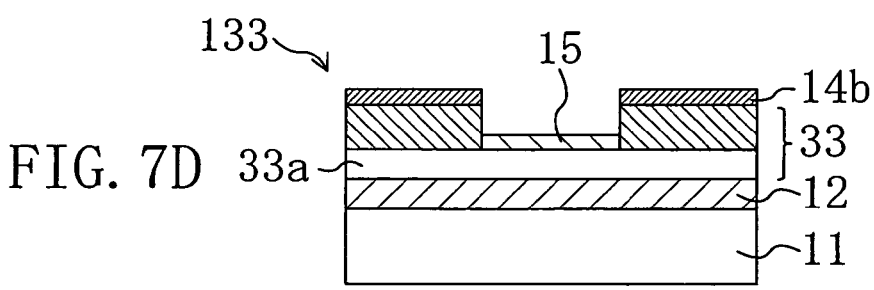

Thereafter, with a nitric acid solution, only the dry etching mask layer 14a is removed from the nitride semiconductor 132 after the dry etching shown in FIG. 7C to form the nitride semiconductor 133 with the electron emitting film shown in FIG. 7D. Then, wet etching shown in FIG. 8 is performed on the nitride semiconductor 133 with the electron emitting film, whereby the damaged layer 15 is removed from the nitride semiconductor 133 with the electron emitting film.

In this removal, if the nitride semiconductor 133 with the electron emitting film is immersed in an etching solution 2, the damaged layer 15 created by the dry etching can be removed as described in the first embodiment. However, if wet etching described below is performed thereon, the p-type semiconductor layer 33a located more internally than the damaged layer 15 created by dry etching can also be etched. Prior to description of procedure of this wet etching, the mechanism by which the p-type semiconductor layer 33a is subjected to wet etching will be described briefly.

To perform wet etching, the presence of holes in the surface of the semiconductor layer is necessary. P-type semiconductors inherently have holes as a majority carrier, but because of the band configuration of the p-type semiconductor, these holes are present in the inside of the semiconductor layer and absent in the surface of the semiconductor layer. However, the band configuration of the p-type semiconductor layer is changed by such a manner that wires electrically connect a nitride semiconductor layer as an anode to a positive terminal of a bias source and a platinum rod or the like as a cathode to a negative terminal of the bias source, the anode and cathode are immersed in an etching solution such as an aqueous solution of potassium hydroxide, and then through the bias source, an external voltage is applied to the nitride semiconductor layer. By this change, the holes can be present in the surface of the p-type semiconductor layer, whereby wet etching proceeds to the p-type semiconductor layer. At this time, electrons present in the inside of the nitride semiconductor layer are emitted through the platinum rod as a cathode into the etching solution. Concrete procedure of this wet etching will be shown below.

Referring to FIG. 8, first, wires connect the layer 14b for the electron emitting of the nitride semiconductor 133 with the electron emitting film to a positive terminal of a bias source 6 and a platinum rod 5 to a negative terminal of the bias source 6. Then, a container 1 is put within an ultrasonic generator 3. The container 1 is filled with an etching solution 2 such as an aqueous solution of potassium hydroxide, and then the nitride semiconductor 133 with the electron emitting film and the platinum rod 5 are immersed in the etching solution 2. An external voltage is then applied through the bias source 6 to the nitride semiconductor 133 with the electron emitting film. Subsequently, the etching solution 2, the nitride semiconductor 133 with the electron emitting film, and the platinum rod 5 are radiated with ultrasonic waves generated by the ultrasonic generator 3. Thereby, wet etching is performed not only on the damaged layer 15 but also on the p-type semiconductor layer 33a. As a result, no irregularities of whisker shapes induced by crystal defects can be created on the surface of the etched semiconductor layer, and concurrently the surface roughness (RMS) of the layer can be 1 nm or smaller. In addition, the nitride semiconductor 133 with the electron emitting film and the etching solution 2 are radiated with ultraviolet light 7, whereby the wet etching rate can be raised to some extent.

If the base substrate 11 is made of a conductive material such as SiC, the positive terminal of the bias source 6 can also be electrically connected not onto the layer 14b for the electron emitting but onto the base substrate 11. Moreover, in the fourth embodiment, since the semiconductor layer to be subjected to wet etching is the p-type semiconductor layer 33a, it inherently has holes. From this, radiation of the ultraviolet light 7 is not absolutely necessary for the wet etching in the fourth embodiment, but radiation of the ultraviolet light 7 to the nitride semiconductor 133 with the electron emitting film raises the wet etching rate to some extent. Therefore, also for the fourth embodiment, it is preferable to perform wet etching with the nitride semiconductor 133 with the electron emitting film radiated with the ultraviolet light 7.

Figure 7E:
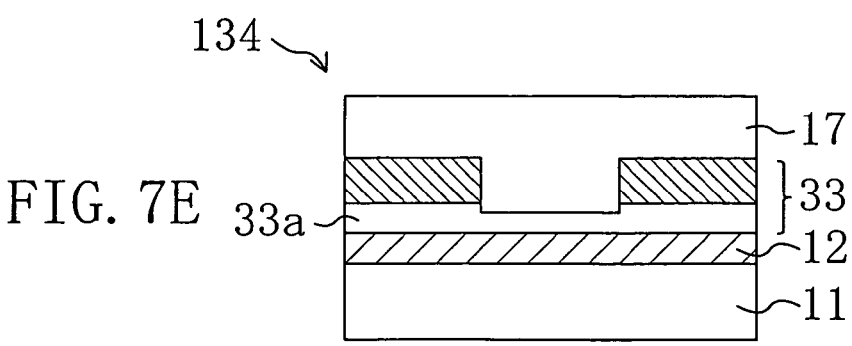

The wet etching process is completed by the above procedure. After removal of the layer 14b for the electron emitting, a crystal of another nitride semiconductor layer 17 is grown by an MOCVD method on the surface of the resulting nitride semiconductor. Thus, a nitride semiconductor element 134 shown in FIG. 7E is fabricated.

The fourth embodiment exerts not only the effects of the first embodiment but also the effect of being able to perform wet etching even on the p-type nitride semiconductor layer 33a located more internally than the damaged layer 15 formed by dry etching. Generally, it is impossible for dry etching to etch a certain layer that is determined in advance. Therefore, if dry etching is performed on a nitride semiconductor layer located above a desired layer, the etching method of the fourth embodiment can etch the desired layer. In contrast to this, if a desired layer can be etched by dry etching process, application of an external voltage is not required and etching can be performed by the etching method of the first embodiment.

Note that the nitride semiconductor element 114 described in the second embodiment can be fabricated using the method for fabricating a nitride semiconductor element according to the fourth embodiment.

Fifth Embodiment

Hereinafter, a fifth embodiment will be described based on FIGS. 9 and 10. FIG. 9 is views of etching steps of the fifth embodiment, and FIG. 10 is a view showing the construction of wet etching of the fifth embodiment. Items shown in FIG. 9 that have the same constructions and functions as those shown in FIG. 1 retain the same reference numerals. Items shown in FIG. 10 that have the same constructions and functions as those shown in FIG. 2 retain the same reference numerals.

In the fifth embodiment, description will be made of the case where wet etching is performed not only to remove a damaged layer 15 created by dry etching but also to etch an n-type nitride semiconductor layer 43a located more internally than the damaged layer. In the fifth embodiment, detail description of items overlapping with those in the first embodiment will be omitted.

Figure 9A:
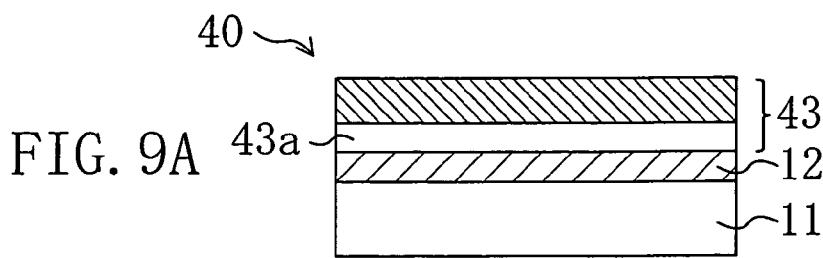
FIGS. 9A through 9E are views of etching steps of a fifth embodiment.

Referring to FIG. 9A, first, by an MOCVD method, a GaN-based buffer layer 12 is grown on a base substrate 11, and then a nitride semiconductor layer 43 is formed on the GaN-based buffer layer 12, thereby forming a nitride semiconductor 40. In this formation, the nitride semiconductor layer 43 is formed with an n-type semiconductor layer 43a such as n-GaN.

Figure 9B:
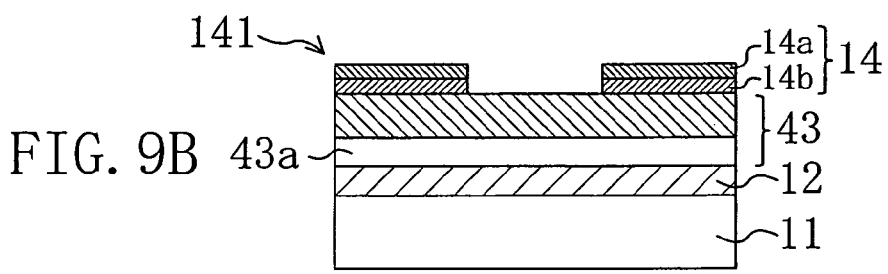

Next, as shown in FIG. 9B, using evaporation and normal photolithography, both edge portions of the upper surface of the nitride semiconductor layer 43 constituting the nitride semiconductor 40 are formed with conductive films 14 each composed of a dry etching mask layer 14a and a layer 14b for an electron emitting. Thus, the nitride semiconductor 141 with the conductive film is formed. The conductive film 14 may be the conductive film 16 described in the third embodiment.

Subsequently, dry etching is performed on the nitride semiconductor 141 with the conductive film shown in FIG. 9B. Thereby, the surface portion of the n-type nitride semiconductor layer 43a on which the dry etching mask layer 14a is not formed is subjected to dry etching to create a damaged layer 15 in the surface of the n-type semiconductor layer 43a.

Figure 9C:
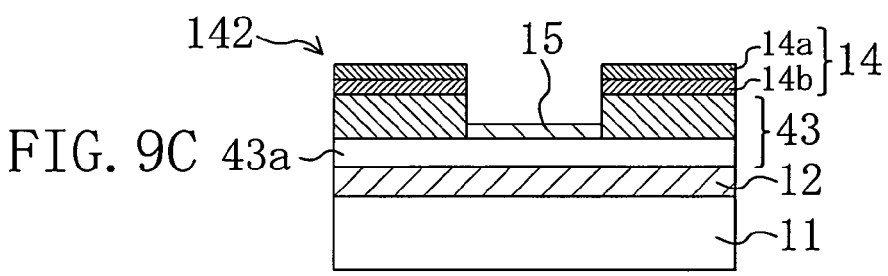
Figure 9D:
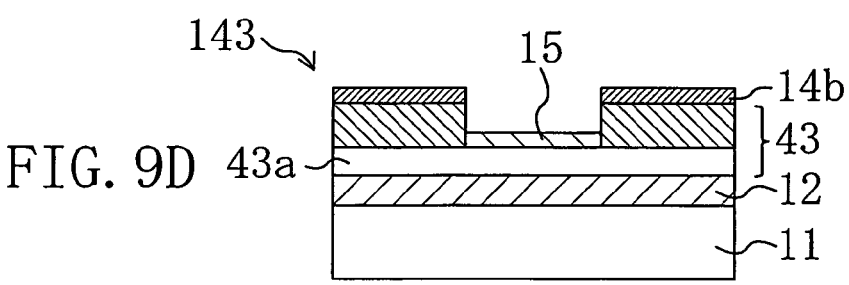

Thereafter, with a nitric acid solution, only the dry etching mask layer 14a is removed from the nitride semiconductor 142 after the dry etching shown in FIG. 9C to form the nitride semiconductor 143 with the electron emitting film shown in FIG. 9D. Then, wet etching shown in FIG. 10 is performed on the nitride semiconductor 143 with the electron emitting film, whereby the damaged layer 15 is removed from the nitride semiconductor 143 with the electron emitting film.

In this removal, if the nitride semiconductor 143 with the electron emitting film is immersed in an etching solution 2, the damaged layer 15 created by the dry etching can be removed as described in the first embodiment. However, if wet etching described below is performed thereon, the n-type semiconductor layer 43a located more internally than the damaged layer 15 created by dry etching can also be etched. Prior to description of procedure of this wet etching, the mechanism by which the n-type semiconductor layer 43a is subjected to wet etching will be described briefly.

To perform wet etching, the presence of holes in the surface of the semiconductor layer is required. N-type semiconductor layers do not have holes inherently. However, if the n-type semiconductor layer is radiated with ultraviolet light with an energy more than the energy of the band gap of the n-type semiconductor layer, hole-electron pairs are produced in the n-type semiconductor layer. Once the hole-electron pairs are produced, the holes of the pairs move, by the band configuration of the n-type semiconductor layer, to the surface of the n-type semiconductor layer even if no external voltage is applied to the n-type semiconductor layer. As a result of this, wet etching for the n-type semiconductor layer starts. Therefore, unlike the fourth embodiment, for implementation of wet etching for the n-type semiconductor layer, it is unnecessary to apply an external voltage to the n-type semiconductor layer, and it is sufficient to radiate the n-type semiconductor layer with ultraviolet light. Concrete procedure of this wet etching will be shown below.

Referring to FIG. 10, first, a container 1 is put within an ultrasonic generator 3. The container 1 is filled with an etching solution 2 such as an aqueous solution of potassium hydroxide, and then the nitride semiconductor 143 with the electron emitting film is immersed in the etching solution 2. Next, the nitride semiconductor 143 with the electron emitting film and the etching solution 2 are radiated with ultraviolet light 7 having a center wavelength of 365 nm or smaller, whereby wet etching is performed not only on the damaged layer 15 but also on the n-type semiconductor layer 43a. With the nitride semiconductor 143 with the electron emitting film radiated with the ultraviolet light 7, the etching solution 2 and the nitride semiconductor 143 with the electron emitting film are radiated with ultrasonic waves generated by the ultrasonic generator 3. Thereby, wet etching is performed on the n-type semiconductor layer 43a. As a result of this etching, no irregularities of whisker shapes induced by crystal defects can be created on the surface of the etched n-type semiconductor layer 43a, and concurrently the surface roughness (RMS) of the layer can be 1 nm or smaller.

In this case, as shown in FIG. 8, if the wet etching is performed with an external voltage applied to the nitride semiconductor 143 with the electron emitting film, the wet etching rate can be raised.

Figure 9E:
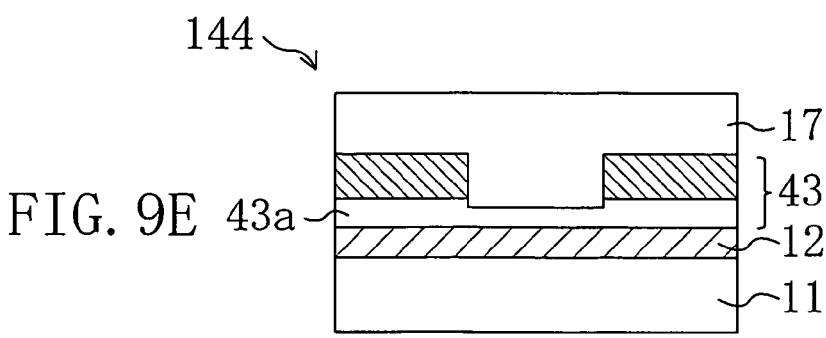

The wet etching process is completed by the above procedure. After removal of the layer 14b for the electron emitting, a crystal of another nitride semiconductor layer 17 is grown by an MOCVD method on the surface of the resulting nitride semiconductor. Thus, a nitride semiconductor element 144 shown in FIG. 9E is fabricated.

Effects of the fifth embodiment are identical to those of the fourth embodiment expect that an n-type semiconductor can be etched.

Sixth Embodiment

Hereinafter, a sixth embodiment will be described based on FIGS. 11 and 12. FIG. 11 is views of etching steps of the sixth embodiment, and FIG. 12 is a view showing the construction of wet etching of the sixth embodiment. Items shown in FIG. 11 that have the same components and functions as those shown in FIG. 1 retain the same reference numerals. Items shown in FIG. 12 that have the same components and functions as those shown in FIG. 2 retain the same reference numerals.

Unlike the first embodiment, the sixth embodiment is a method for fabricating a nitride semiconductor element by performing only wet etching with no dry etching.

Figure 11A:
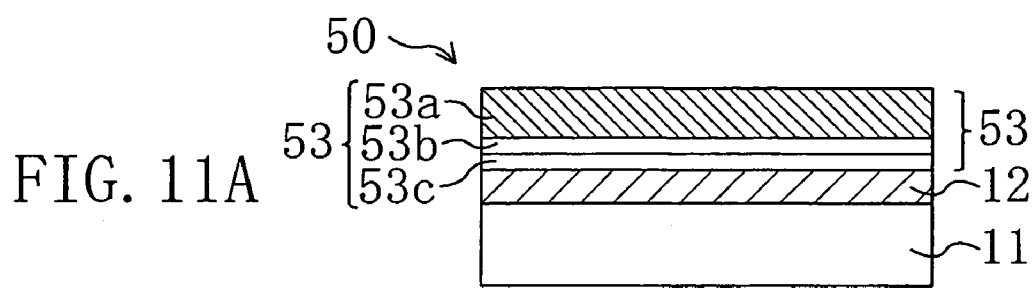
FIGS. 11A through 11C are views of etching steps of a sixth embodiment.
Figure 12:
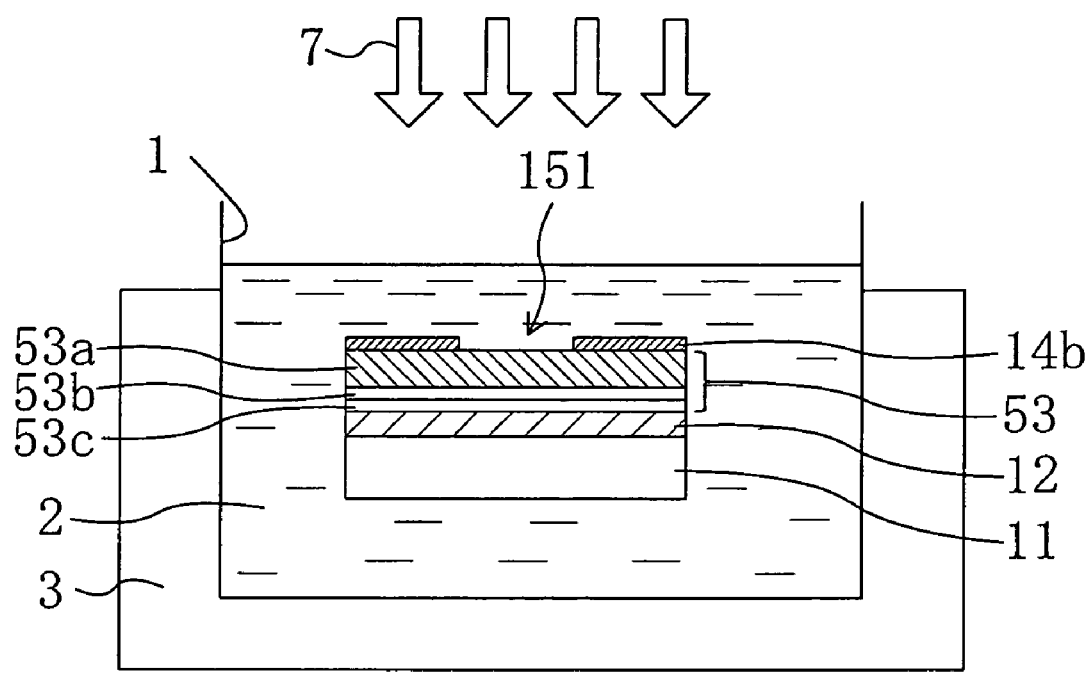
FIG. 12 is a view showing the construction of wet etching of the sixth embodiment.

Referring to FIG. 11A, first, by an MOCVD method, a GaN-based buffer layer 12 is formed on a base substrate 11, and then a nitride semiconductor layer 53 is formed on the GaN-based buffer layer 12, thereby forming a nitride semiconductor 50.

The nitride semiconductor layer 53 is made of GaN, AlN, InN, and a mixed crystal of these materials. The nitride semiconductor layer 53 contains InGaN multiple quantum well (MQW) as an active layer and an n-AlGaN current blocking layer 53a, and is represented by n-AlGaN/p-GaN/InGaN MQW/n-GaN. To be more specific, the nitride semiconductor layer 53 is constructed as follows: on the surface of the GaN-based buffer layer 12, an n-GaN layer and an InGaN multiple quantum well (MQW) as an active layer are formed (which are shown by 53c as a single layer in FIG. 11A); a p-GaN layer 53b is formed on the layer 53c; and an n-AlGaN current blocking layer 53a is formed on the p-GaN layer 53b. In this structure, a layer formed by sequentially stacking an n-GaN layer, an n-AlGaN layer (cladding layer), and an n-GaN layer (guide layer) is called the n-GaN layer. The thickness of the n-AlGaN current blocking layer 53a is preferably from 50 to 300 nm inclusive, and the thickness of the p-GaN layer 53b is preferably from 20 to 200 nm inclusive. The most preferable thicknesses of the n-AlGaN current blocking layer 53a, the p-GaN layer 53b, and the n-GaN layer are 150 nm, 125 nm, and 4350 nm, respectively. In the layers forming the n-GaN layer, the most preferable thicknesses of the n-GaN layer (guide layer), the n-AlGaN layer (cladding layer), and the n-GaN layer are 150 nm, 1200 nm, and 3000 nm, respectively. The p-GaN layer 53b serves as a layer for stopping wet etching. It is also acceptable that the active layer of the nitride semiconductor layer 53 is formed of an InGaN single quantum well.

Figure 11B:
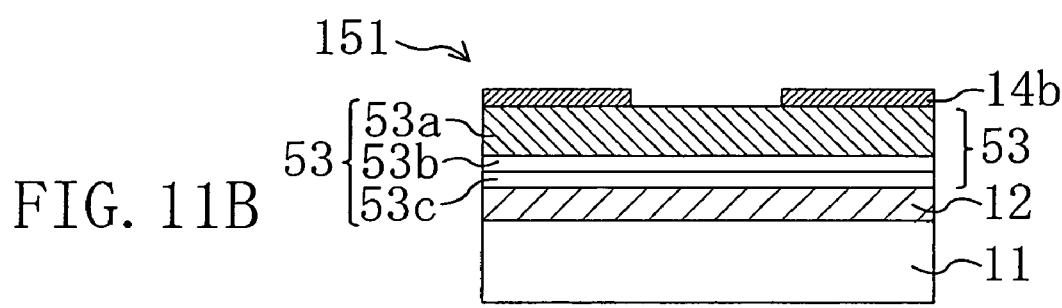

Next, as shown in FIG. 11B, using evaporation and normal photolithography, a Ti layer and a Pt layer are sequentially formed on both edge portions of the upper surface of the nitride semiconductor layer 53 to form a layer 54b for electron emitting. Thus, the nitride semiconductor 151 with the electron emitting film is formed. It is noted that the layer 54b for electron emitting is not limited to a film made of Ti and Pt, and may be formed of another film mentioned in the first embodiment.

Subsequently, wet etching shown in FIG. 12 is performed on the nitride semiconductor 151 with the electron emitting film. To perform wet etching of the sixth embodiment, first, a container 1 is put within an ultrasonic generator 3. The container 1 is filled with an etching solution 2 such as an aqueous solution of potassium hydroxide, and then the nitride semiconductor 151 with the electron emitting film is immersed in the etching solution 2. Next, with the nitride semiconductor 151 with the electron emitting film radiated with ultraviolet light 7, the etching solution 2 and the nitride semiconductor 151 with the electron emitting film are radiated with ultrasonic waves generated by the ultrasonic generator 3. Whereby, wet etching is performed on the n-AlGaN current blocking layer 53a.

During this etching, the n-AlGaN current blocking layer 53a is wet etched by the mechanism of the wet etching for the n-type semiconductor layer described in the fifth embodiment. The detailed description will be made below.

The n-AlGaN current blocking layer 53a includes no hole inherently but the hole-electron pairs are produced in the n-AlGaN current blocking layer 53a by irradiating the surface of the nitride semiconductor layer 151 with the electron emitting film with the ultraviolet light 7. With the layer 54b for electron emitting formed at a part of the surface portion of the nitride semiconductor layer 151 with the electron emitting film, the produced electrons are emitted from the n-AlGaN current blocking layer 53a to the etching solution 2 through the layer 54b for electron emitting. Also, in the presence of the produced holes in the surface portion of the n-AlGaN current blocking layer 53a, the n-AlGaN current blocking layer 53a is wet etched by the reaction between the holes and the etching solution 2. Further, the p-GaN layer 53b is provided under the n-AlGaN current blocking layer 53a in the present embodiment, and therefore, the p-GaN layer 53b is exposed when all the part of the n-AlGaN current blocking layer 53a where the layer 54b for electron emitting is not formed is wet etched. In general, a p-type semiconductor layer and an n-type semiconductor layer are different from each other in band shape in the vicinity of the surface thereof and holes cannot be present in the surface portion of the p-type semiconductor layer (see the fourth embodiment). Therefore, wet etching is not performed on the p-GaN layer 53b in the wet etching method in the present embodiment. Thus, the p-GaN layer 53b serves as a layer for stopping wet etching. In this connection, the n-AlGaN current blocking layer 53a can be etched by the thickness of the n-AlGaN current blocking layer 53a in the etching method in the present embodiment, with a result of accurate fabrication of a semiconductor element as designed.

Figure 11C:
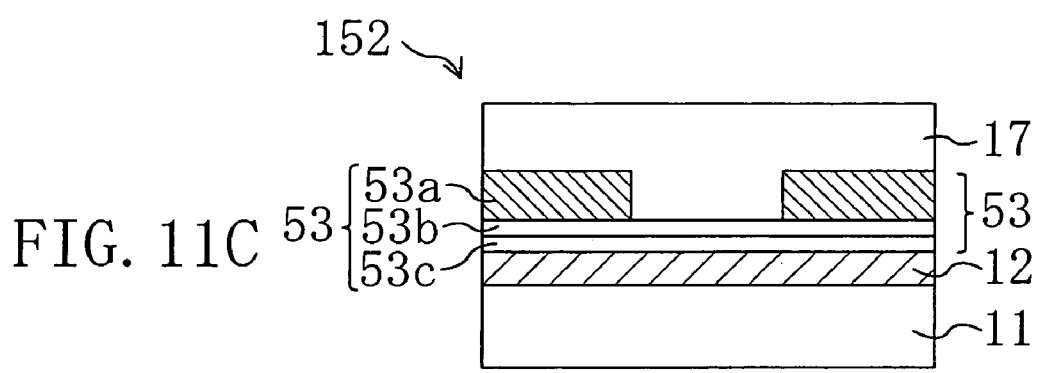

The wet etching process is completed by the above procedure. After removal of the layer 54b for the electron emitting, an epitaxial layer of another nitride semiconductor layer 17 is grown by an MOCVD method on the surface of the resulting nitride semiconductor. Thus, a nitride semiconductor element 152 shown in FIG. 11C is fabricated. Further, the nitride semiconductor element 152 can be used as a semiconductor laser element in which a wet-etched part of the nitride semiconductor layer 53 serves as a waveguide.

In the etching method in the present embodiment, only the n-AlGaN current blocking layer 53a can be wet etched selectively. Therefore, the active layer located lower than the n-AlGaN current blocking layer 53a is prevented from damage by over etching and the p-GaN layer 53b below the n-AlGaN current blocking layer 53a can be thinned. Hence, in a semiconductor laser element fabricated using this etching method, high output can be obtained and the yield becomes excellent.

Seventh Embodiment

Hereinafter, a seventh embodiment will be described in detail based on FIGS. 13 and 14. FIG. 13 is views of etching steps of the seventh embodiment, and FIG. 14 is a view showing the construction of wet etching of the seventh embodiment. Items shown in FIG. 13 that have the same components and functions as those shown in FIG. 1 retain the same reference numerals. Items shown in FIG. 14 that have the same components and functions as those shown in FIG. 2 retain the same reference numerals.

The first to sixth embodiments have described the methods for fabricating a nitride semiconductor element employed as a laser element for use in a semiconductor laser. The seventh embodiment will describe a method for fabricating a nitride semiconductor element employed as a field-effect transistor having a heterostructure in which two-dimensional electron gas is produced (heterostructure field-effect transistor; hereinafter, referred simply to as "HFET"). In the seventh embodiment, detail description of items overlapping with those of the etching process in the first embodiment will be omitted.

Figure 13A:
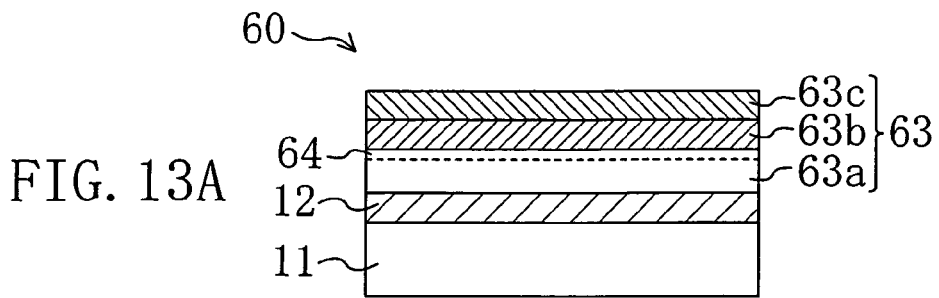
FIGS. 13A through 13E are views of etching steps of a seventh embodiment.
Figure 14:
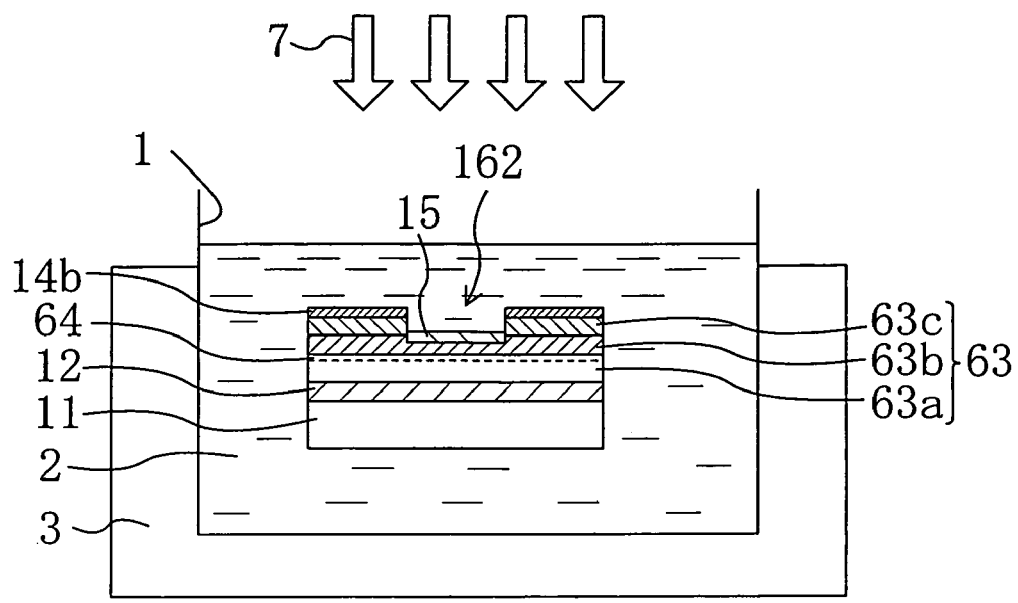
FIG. 14 is a view showing the construction of wet etching of the seventh embodiment.

Referring to FIG. 13A, first, by an MOCVD method, a GaN-based buffer layer 12 is grown on a base substrate 11. On the GaN-based buffer layer 12, a GaN electron transit layer 63a, an AlGaN electron supply layer 63b, and an AlGaInN cap layer 63c are sequentially stacked to form a nitride semiconductor layer 63. Thus, a nitride semiconductor 60 can be formed. In this structure, the Al content of the AlGaN electron supply layer 63b is 25%, and the Al content of the AlGaInN cap layer 63c is smaller than that of the AlGaN electron supply layer 63b. The AlGaN electron supply layer 63b is doped with Si of $2\times10^{18}$ cm$^{-3}$ as an n-type dopant, and the AlGaInN cap layer 63c is doped with Si of $5\times10^{18}$ cm$^{-3}$ as an n-type dopant. Therefore, the AlGaN electron supply layer 63b and the AlGaInN cap layer 63c are n-type semiconductors. At the interface between the GaN electron transit layer 63a and the AlGaN electron supply layer 63b, two-dimensional electron gas 64 is produced.

Figure 13B:
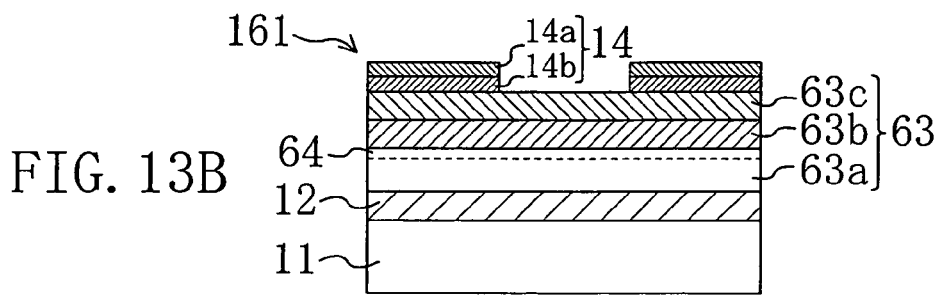

Next, as shown in FIG. 13B, using evaporation and normal photolithography, both edge portions of the upper surface of the AlGaInN cap layer 63c constituting the nitride semiconductor layer 63 of the nitride semiconductor 60 are formed with conductive films 14 each composed of a dry etching mask layer 14a and a layer 14b for an electron emitting. Thus, a nitride semiconductor 161 with the conductive film is formed. As the conductive film 14, the conductive film 16 described in the third embodiment may be used.

Subsequently, dry etching is performed on the nitride semiconductor 161 with the conductive film shown in FIG. 13B. Thereby, the surface portion of the AlGaInN cap layer 63c on which the dry etching mask layer 14a is not formed is subjected to dry etching to create a damaged layer 15 in the surface of the AlGaInN cap layer 63c.

Figure 13C:
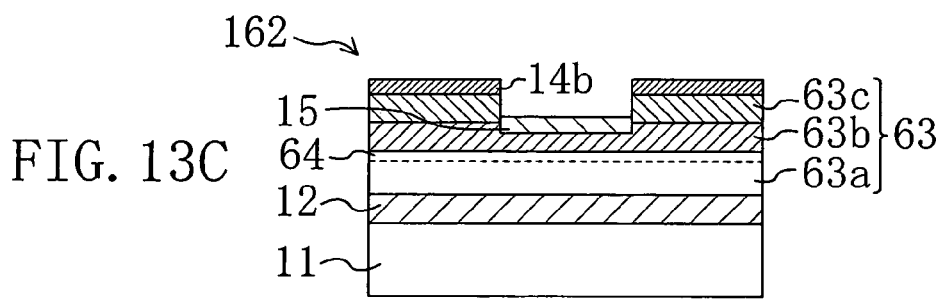
Figure 13D:
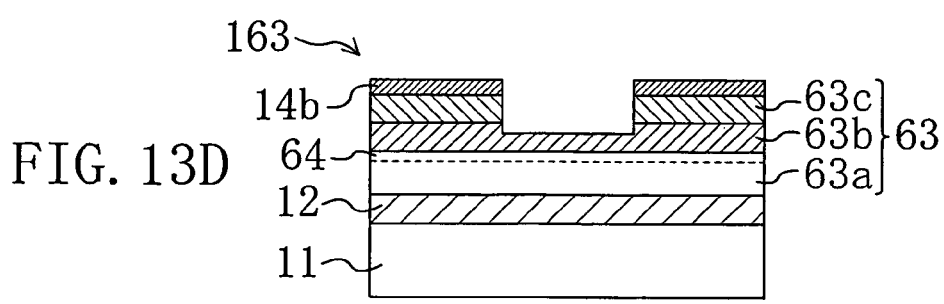
Figure 13E:
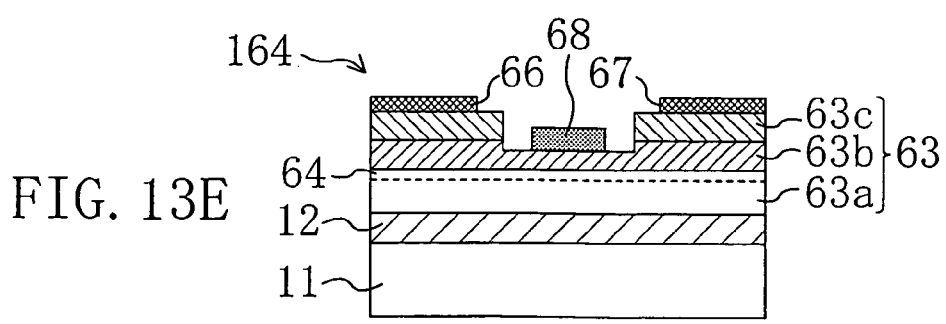

Thereafter, with a nitric acid solution, only the dry etching mask layer 14a is removed from the nitride semiconductor after the dry etching to form a nitride semiconductor 162 with the electron emitting film shown in FIG. 13C. Then, wet etching shown in FIG. 14 is performed on the nitride semiconductor 162 with the electron emitting film. Thereby, the damaged layer 15 is removed from the nitride semiconductor 163 with the electron emitting film to form a nitride semiconductor 163 after the wet etching shown in FIG. 13D.

The wet etching process is completed by the above procedure. After removal of the layer 14b for the electron emitting from the nitride semiconductor 163 after the wet etching, a source electrode 66 and a drain electrode 67 are formed on the remaining AlGaInN cap layer 63c having not been etched, and a gate electrode 68 is formed on the concave of the AlGaN electron supply layer 63b having been formed by the dry etching. In this formation, the source electrode 66 is provided on the lefthand side as viewed in FIG. 13D, while the drain electrode 67 is provided on the righthand side as viewed in FIG. 13D. Thus, a nitride semiconductor element 164 shown in FIG. 13E can be fabricated and employed as an HFET for switching.

Herein, an operation method of the nitride semiconductor element 164 will be described which serves as an HFET for switching. At the interface between the GaN electron transit layer 63a and the AlGaN electron supply layer 63b, an energy gap caused by the difference in band gap between AlGaN and GaN, and an internal electric field generated by the piezoelectric effect resulting from lattice mismatch are present. As a result of this, electrons in the AlGaN electron supply layer 63b are localized around the interface between the GaN electron transit layer 63a and the AlGaN electron supply layer 63b to produce the two-dimensional electron gas 64. The concentration of the two-dimensional electron gas 64 is determined by the magnitude of the internal electric field present at the interface between the GaN electron transit layer 63a and the AlGaN electron supply layer 63b. Therefore, if a voltage is applied to the gate electrode 68 to change the internal electric field, the concentration of the two-dimensional electron gas 64 can be controlled. If a voltage is applied to the gate electrode 68 to increase the internal electric field, the concentration of the two-dimensional electron gas 64 rises. Then, a current flows between the source electrode 66 and the drain electrode 67, and a switch becomes the ON state. On the other hands, if a reverse electric field is applied to the gate electrode 68, the internal electric field is reduced and the concentration of the two-dimensional electron gas 64 is decreased. Therefore, a current flows with difficulty, and a switch becomes the OFF state. Consequently, control of a voltage placed on the gate electrode 68 can control currents flowing through the source electrode 66 and the drain electrode 67. As a result, the nitride semiconductor element 164 can be used as an HFET for switching. The source electrode 66 and the drain electrode 67 are not limited to the arrangement shown in FIG. 13E. Alternatively, the source electrode 66 may be provided on the righthand side as viewed in FIG. 13E, while the drain electrode 57 may be provided on the lefthand side as viewed in FIG. 13E.

Conclusive description will be made of effects exerted by the fabrication method of the nitride semiconductor element 164 according to the seventh embodiment. When the nitride semiconductor is subjected to dry etching, the damaged layer 15 is created in the surface of the nitride semiconductor. However, a removal method of this damaged layer 15 has never been proposed previously. Therefore, if the gate electrode 68 or the like is provided on the portion subjected to the dry etching, a leakage current occurs due to the created damaged layer 15. By this current, transistors fabricated by the conventional method have poor performances. However, in the seventh embodiment, wet etching is performed after dry etching has been performed using the conductive film 14 as a mask, thereby removing the damaged layer 15. Therefore, even if the gate electrode 68 is provided on the surface of the nitride semiconductor layer 63 subjected to the dry etching, a leakage current can be suppressed because the damaged layer 15 has been removed. As a result, this method can fabricate transistors with good performances. Moreover, in the seventh embodiment, a voltage placed on the gate electrode 68 provided in the nitride semiconductor element 164 can be changed to vary the electron concentration of the two-dimensional electron gas 64. Therefore, the nitride semiconductor element 164 is usable as an HFET for switching. Furthermore, the effects provided by the fabrication method of the first embodiment, that is, the ability to simplify the construction of wet etching and the ability to reduce the surface roughness of the nitride semiconductor element after the fabrication to 1 nm or smaller can also be provided by the fabrication method of the seventh embodiment.

OTHER EMBODIMENT

Any well-known dry etchings can be applicable to the dry etchings described in the first to seventh embodiments.

The first to sixth embodiments have described the semiconductor laser using a multilayer film of nitride semiconductor including an InGaN active layer, and the seventh embodiment has described the HFET having a heterostructure in which two-dimensional electron gas is produced. However, the fabrication method of a nitride semiconductor element representing the present invention is not limited to only the processes for these devices. It goes without saying that the fabrication method of the present invention is applicable to another device using a nitride semiconductor, such as a light emitting device including LED (light emitting diode) and an electronic device including HBT (heterojunction bipolar transistor).

The wet etching methods of the sixth and seventh embodiments are not limited to the wet etching described in the first embodiment, and alternatively the wet etching described in the fourth embodiment is applicable to these methods. In such a case, the effects described in the fourth embodiment can also be provided.

What is claimed is:

1. A method for fabricating a nitride-based compound semiconductor element, comprising the steps of:
forming a nitride-based compound semiconductor layer on a base substrate;
forming a conductive film as an etching mask on part of the surface of the nitride-based compound semiconductor layer;
performing dry etching on the nitride-based compound semiconductor layer; and
performing wet etching on the nitride-based compound semiconductor layer by emitting electrons from the nitride-based compound semiconductor layer through the conductive film to the outside, the wet etching being performed without applying an external voltage to the conductive film and without radiating the nitride-based compound semiconductor layer with ultraviolet light,
wherein in the step of performing dry etching, a damaged layer is created in the nitride-based compound semiconductor layer, and
in the step of performing wet etching, the damaged layer is removed.

2. A method for fabricating a nitride-based compound semiconductor element, comprising the steps of:
forming a nitride-based compound semiconductor layer on a base substrate;
forming, on part of the surface of the nitride-based compound semiconductor layer, a multilayer conductive film in which an uppermost layer is a dry etching mask layer and a layer lower than the dry etching mask layer is a layer for electron emitting;
performing dry etching on the nitride-based compound semiconductor layer;
removing the dry etching mask layer; and
performing wet etching on the nitride-based compound semiconductor layer by emitting electrons from the nitride-based compound semiconductor layer through the layer for electron emitting to the outside, the wet etching being performed without applying an external voltage to the layer for electron emitting and without radiating the nitride-based compound semiconductor layer with ultraviolet light,
wherein in the step of performing dry etching, a damaged layer is created in the nitride-based compound semiconductor layer, and
in the step of performing wet etching, the damaged layer is removed.

3. The method of claim 1, wherein the conductive film includes a layer containing Ni.

4. The method of claim 1 or 2, wherein the nitride-based compound semiconductor layer is provided with at least a single layer containing Al, and the dry etching is performed on the layer containing Al.

5. A method for fabricating a nitride-based compound semiconductor element, comprising the steps of:
forming a nitride-based compound semiconductor layer comprising a multilayer whose uppermost layer is a n-type nitride-based compound semiconductor layer on a base substrate;
forming, on part of the surface of the n-type nitride-based compound semiconductor layer, a conductive film as an electron emitting film for emitting electrons from the n-type nitride-based compound semiconductor layer to the outside; and
performing wet etching on the n-type nitride-based compound semiconductor layer by emitting electrons from the n-type nitride-based compound semiconductor layer through the conductive film to the outside, the wet etching being performed without applying an external voltage to the conductive film while radiating the n-type nitride-based compound semiconductor layer with ultraviolet light,
wherein the wet etching is performed on the n-type nitride-based compound semiconductor layer without performing dry etching.

6. The method of claim 5, wherein the nitride-based compound semiconductor layer is formed of a plurality of layers in which a layer lower than the n-type nitride-based compound semiconductor layer is a p-type nitride-based compound semiconductor layer, and
in the step of performing wet etching, the p-type nitride-based compound semiconductor layer serves as a layer for stopping wet etching.

7. The method of claim 6, wherein the n-type nitride-based compound semiconductor layer is an AlGaN layer.

8. The method of claim 1, wherein the conductive film has a layer containing Ti and Au or a layer containing Ti and Pt.

9. The method of any one of claims 1, 2 and 5,
wherein the nitride-based compound semiconductor layer is formed of a plurality of layers, and
the plurality of layers are formed of a plurality of nitride-based semiconductors having different element compositions, respectively.

10. The method of any one of claims 1, 2 and 5, wherein the wet etching uses a solution containing one of KOH, NaOH, $H_3PO_4$, $H_2SO_4$, and HCl.

11. The method of any one of claims 1, 2 and 5, wherein in the step of performing wet etching, the nitride-based compound semiconductor layer is radiated with ultrasonic waves.

12. The method of any one of claims 1, 2 and 5, wherein another nitride-based compound semiconductor layer is provided on the nitride-based compound semiconductor layer subjected to the wet etching.

13. The method of claim 2,
wherein a Ni layer is used as the dry etching mask layer, and
a layer comprising Au or Pt is used as the layer for electron emitting.

14. The method of claim 5,
wherein a layer comprising Ti and Pt is used as the conductive film.

* * * * *